United States Patent
Tanaka et al.

(10) Patent No.: US 8,349,714 B2
(45) Date of Patent: Jan. 8, 2013

(54) METHOD OF CRYSTALLIZING SEMICONDUCTOR FILM AND METHOD OF MANUFACTURING SEMICONDUCTOR DEVICE

(75) Inventors: Koichiro Tanaka, Kanagawa (JP); Tomoaki Moriwaka, Kanagawa (JP); Takatsugu Omata, Kanagawa (JP); Junpei Momo, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 488 days.

(21) Appl. No.: 11/972,029

(22) Filed: Jan. 10, 2008

(65) Prior Publication Data
US 2008/0214021 A1    Sep. 4, 2008

(30) Foreign Application Priority Data
Jan. 24, 2007    (JP) ................... 2007-013868

(51) Int. Cl.
*H01L 21/268* (2006.01)
(52) U.S. Cl. .. 438/487; 438/166; 438/486; 257/E21.134
(58) Field of Classification Search ............ 257/66, 257/E21.134; 438/149, 150, 166, 482, 486, 438/487; 250/492.2, 492.22, 492.23
See application file for complete search history.

(56) References Cited

U.S. PATENT DOCUMENTS

| | | | |
|---|---|---|---|
| 5,313,076 A | | 5/1994 | Yamazaki et al. |
| 5,621,224 A | * | 4/1997 | Yamazaki et al. ............. 257/66 |
| 5,962,869 A | | 10/1999 | Yamazaki et al. |
| 6,322,625 B2 | | 11/2001 | Im |
| 7,135,388 B2 | * | 11/2006 | Ryu et al. ...................... 438/478 |
| 7,381,632 B2 | * | 6/2008 | Inui et al. ...................... 438/487 |
| 7,615,423 B2 | * | 11/2009 | Kusumoto et al. ............ 438/161 |
| 7,662,703 B2 | | 2/2010 | Moriwaka et al. |
| 2005/0003591 A1 | * | 1/2005 | Takaoka et al. ............... 438/151 |
| 2005/0169330 A1 | | 8/2005 | Hongo et al. |

(Continued)

FOREIGN PATENT DOCUMENTS

WO    WO 97/45827 A1    12/1997

(Continued)

OTHER PUBLICATIONS

A. Hara et al., "Ultra-high performance Poly-Si TFTs on a Glass by a Stable Scanning CW Laser Lateral Crystallization", Digest of Technical Papers, AM-LCD '01, pp. 227-230 (2001).

*Primary Examiner* — Steven J Fulk
*Assistant Examiner* — Eric Ward
(74) *Attorney, Agent, or Firm* — Nixon Peabody LLP; Jeffrey L. Costellia

(57) ABSTRACT

It is an object of the present invention to align the plane orientations of crystal grains of a semiconductor film crystallized by irradiation with a linear laser beam with a width of less than or equal to 5 μm. By performing irradiation with the linear laser beam condensed by an aspheric cylindrical lens or a gradient index lens to completely melt the semiconductor film and scanning the linear laser beam, the completely melted semiconductor film is made to grow laterally. Because the linear beam is very narrow, the width of the semiconductor which is in a liquid state is also narrow, so the occurrence of turbulent flow in the liquid semiconductor is suppressed. Therefore, growth directions of adjacent crystal grains do not become disordered due to turbulent flow and are unformalized, and thus the plane orientations of the laterally grown crystal grains can be aligned.

12 Claims, 23 Drawing Sheets

U.S. PATENT DOCUMENTS

| | | | |
|---|---|---|---|
| 2005/0170618 A1* | 8/2005 | Hatano et al. | 438/486 |
| 2006/0254500 A1* | 11/2006 | Im et al. | 117/43 |
| 2006/0292808 A1* | 12/2006 | Autryve et al. | 438/308 |
| 2007/0063281 A1 | 3/2007 | Takafuji et al. | |
| 2007/0070283 A1* | 3/2007 | Maki et al. | 349/146 |
| 2007/0087488 A1 | 4/2007 | Moriwaka | |
| 2007/0105263 A1* | 5/2007 | Hatano et al. | 438/57 |
| 2007/0138146 A1* | 6/2007 | Takami et al. | 219/121.6 |
| 2007/0222038 A1 | 9/2007 | Moriwaka | |
| 2008/0171410 A1 | 7/2008 | Moriwaka et al. | |

FOREIGN PATENT DOCUMENTS

| | | | |
|---|---|---|---|
| WO | WO2006/022196 | * | 2/2006 |

* cited by examiner

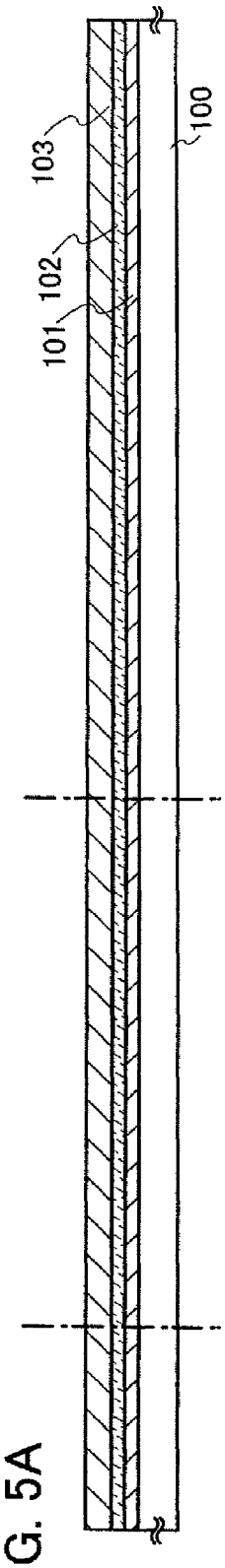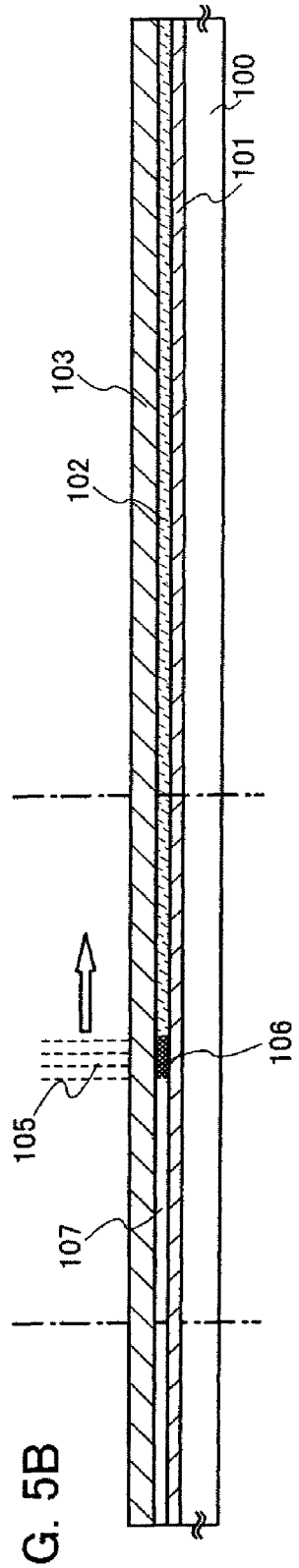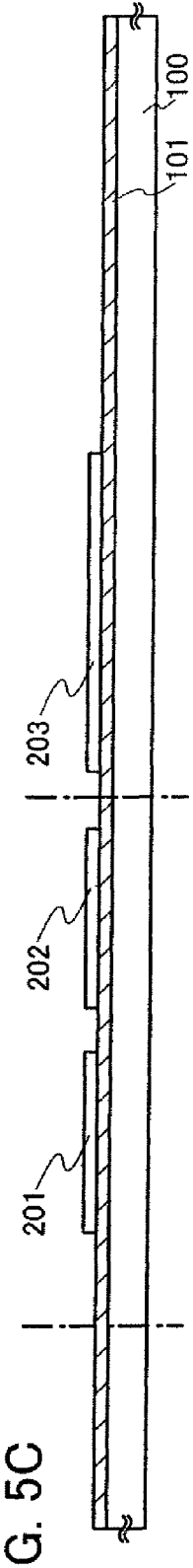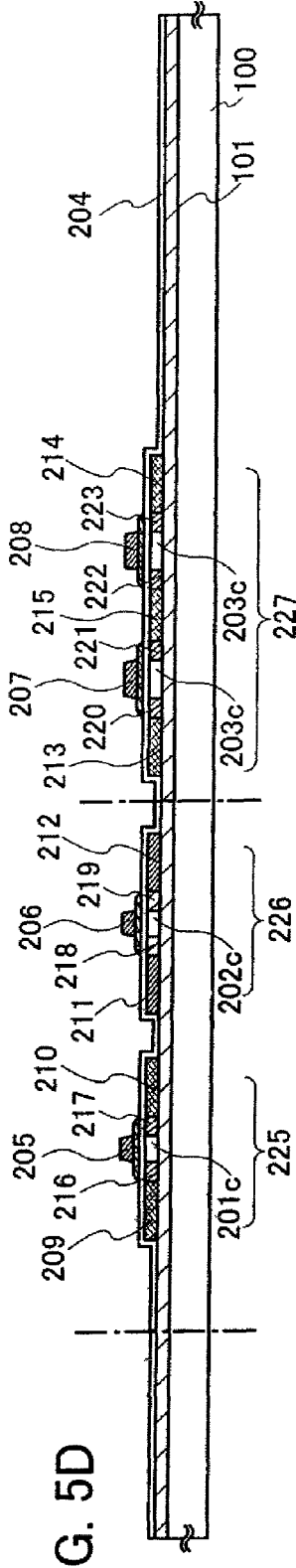

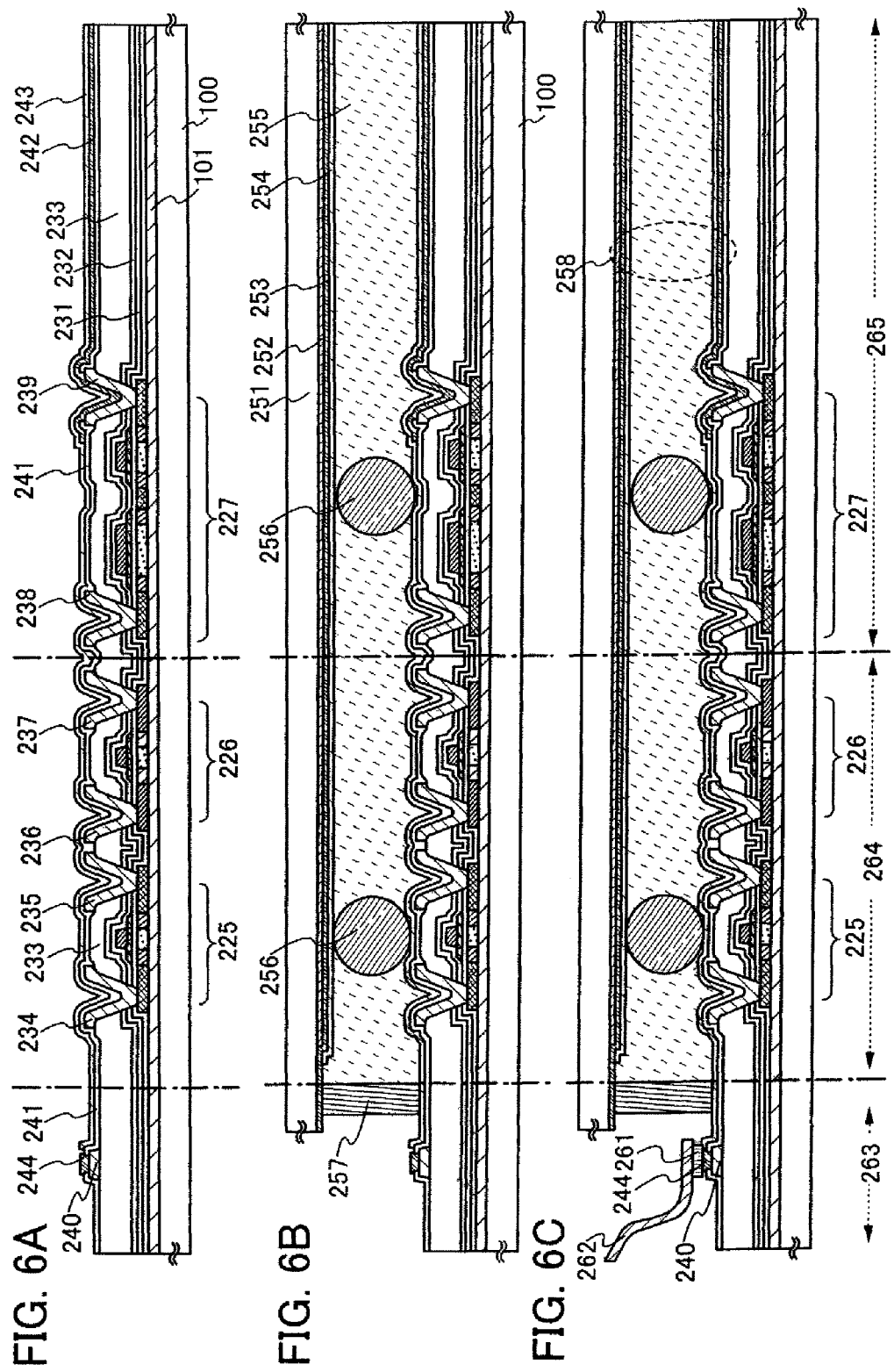

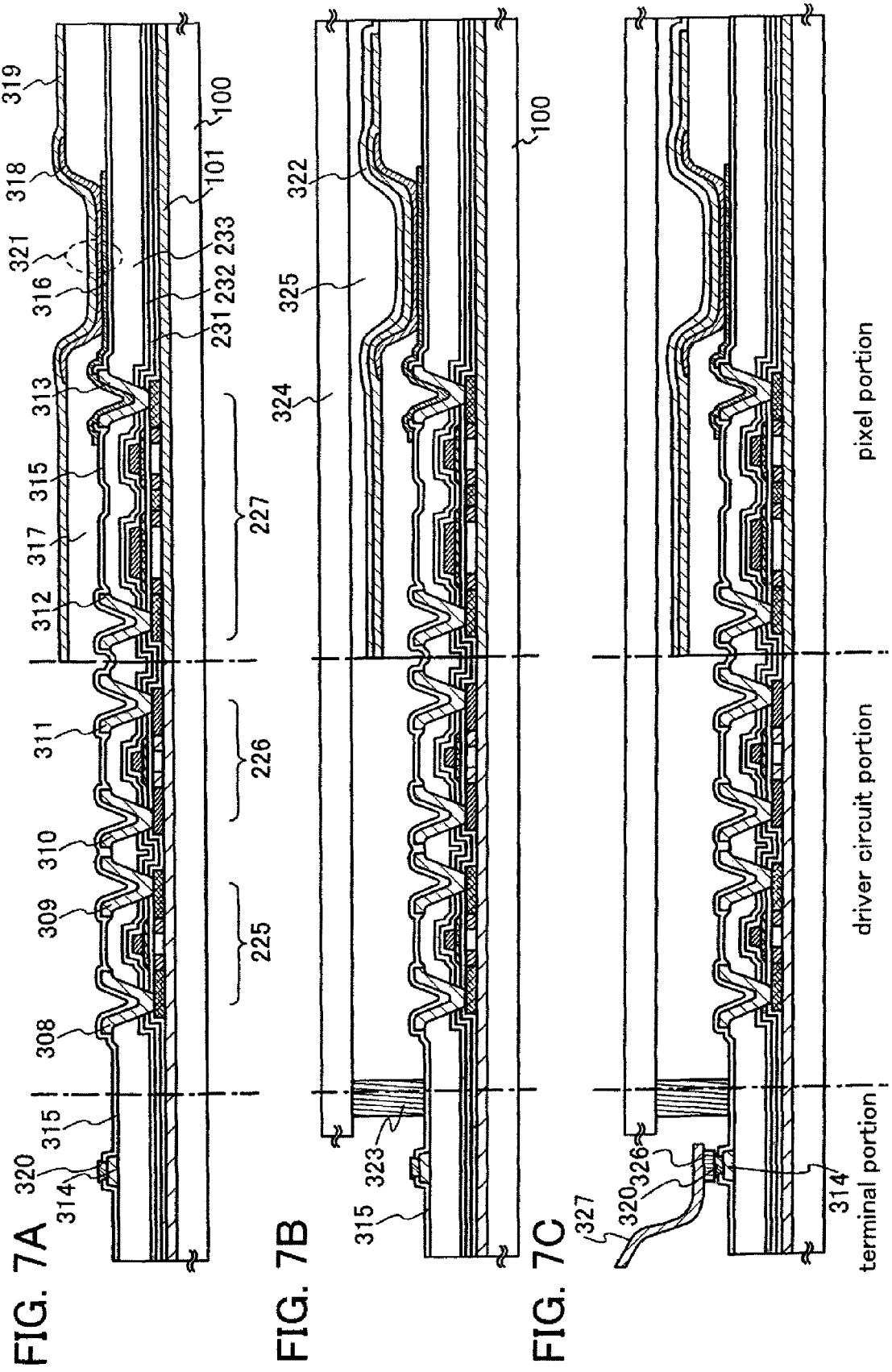

FIG. 8A
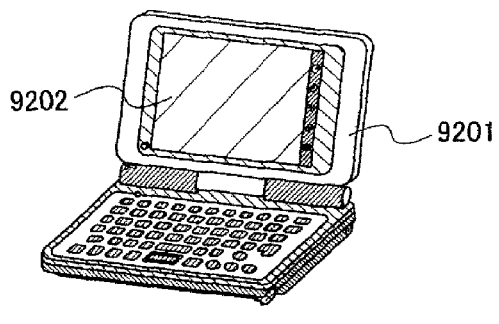
FIG. 8B
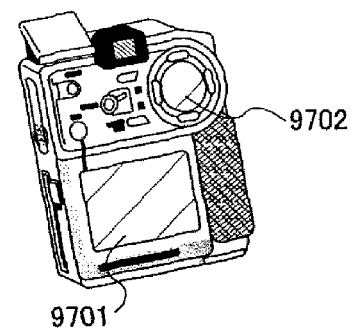
FIG. 8C
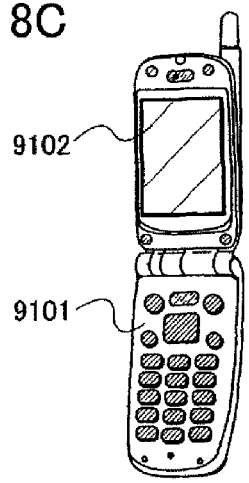
FIG. 8D
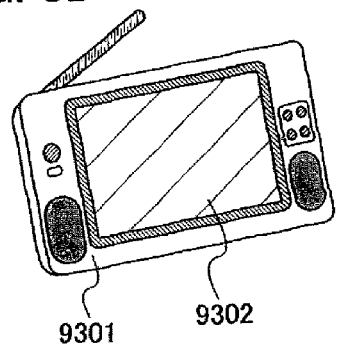
FIG. 8F
FIG. 8E
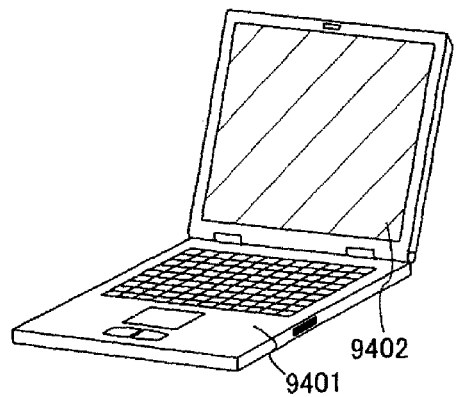
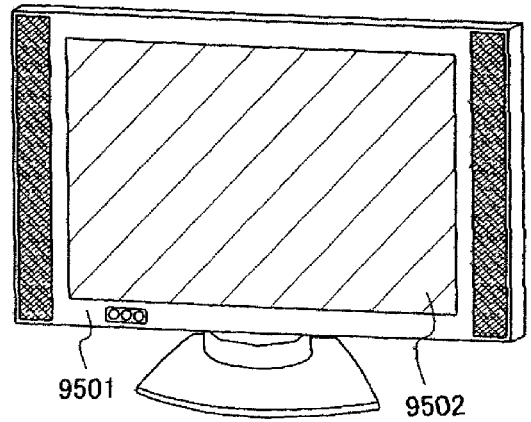

FIG. 17

| Surf: Type | Radius | Thickness | Glass | Semi-Diameter | Conic | Par 0 (unused) | 2nd Order Term | 4th Order Term |
|---|---|---|---|---|---|---|---|---|
| OBJ Standard | Infinity | Infinity | | 0.000000 | 0.000000 | | | |
| STO Even Asphere | 10.380000 | 3.500000 | BK7 | 5.000000 | 0.000000 | | 0.025199 V | 0.000065 |
| 2 Standard | Infinity | 10.812578 V | | 4.588705 | 0.000000 | | | |
| 3 Standard | Infinity | -0.002000 | | 0.000194 | 0.000000 | | | |
| IMA Standard | Infinity | | | 0.000655 | 0.000000 | | | |

METHOD OF CRYSTALLIZING SEMICONDUCTOR FILM AND METHOD OF MANUFACTURING SEMICONDUCTOR DEVICE

BACKGROUND OF THE INVENTION

1. Field of the Invention

The present invention relates to technology for crystallizing a semiconductor film by irradiation with a laser beam. Further, the present invention relates to a method of manufacturing a semiconductor device using a crystallized semiconductor film.

2. Description of the Related Art

Extensive research has been conducted and many proposals have been made concerning technology for forming a crystalline silicon film by irradiating an amorphous silicon film with a laser beam and crystallizing the amorphous silicon film. Active matrix liquid crystal display devices in which a polycrystalline silicon film obtained by crystallizing an amorphous silicon film with an excimer laser is used have already been commercialized as high-resolution panels for portable telephones and the like.

Lasers used for laser annealing are broadly classified into two types, pulsed lasers and continuous wave lasers, depending on their method of oscillation. Excimer lasers are pulsed lasers. In recent years, it has been reported that crystalline silicon having large grain crystals can be formed more successfully when a continuous wave laser such as an Nd:YVO$_4$ laser is used than when a pulsed laser such as an excimer laser is used. For example, in Non-Patent Document 1, it is disclosed that concerning crystalline silicon, grain boundaries are parallel to a scanning direction of a laser beam and a very large grain size of 3×20 μm is obtained; that the (100) orientation is dominant; and that a thin film transistor with a field-effect mobility of 532 cm$^2$/Vs was manufactured (Akito Hara and five other authors, AM-LCD '01 DIGEST OF TECHNICAL PAPERS, 2001, pp. 227-230).

SUMMARY OF THE INVENTION

The present inventors conducted research in an effort to fabricate a crystalline semiconductor film with superior characteristics by using laser beam irradiation and ultimately to fabricate a single crystal semiconductor film by crystallizing a non-single-crystal semiconductor film. As a result of the research, they developed a method by which a crystalline semiconductor film in which plane orientations of crystals are aligned at greater than or equal to a certain percentage in three planes which cross at right angles can be formed from a non-single-crystal semiconductor film. This crystallization method will be described below with reference to FIG. 22.

A non-single-crystal semiconductor film which is to be crystallized is prepared. Here, an example in which an amorphous silicon film is crystallized will be described. As shown in FIG. 22, over a glass substrate 1, an insulating film 2 which serves as a base which has a thickness of 50 to 150 nm is formed; and over the insulating film 2 which serves as a base, an amorphous silicon film 3 with a thickness of greater than or equal to 20 nm and less than or equal to 100 nm is formed. A cap film 4 is formed over the amorphous silicon film 3. The cap film 4 is formed using a film which transmits a laser beam with a thickness of greater than or equal to 200 nm and less than or equal to 1000 nm. For example, the cap film 4 can be formed using silicon oxide or silicon nitride. By irradiating the amorphous silicon film 3 with a linear laser beam 5 which is passed through the cap film 4, the amorphous silicon film 3 is crystallized and a crystalline semiconductor 6 is formed. The linear laser beam 5 is scanned in the minor axis direction of the linear laser beam 5, as shown by the arrow in FIG. 22.

As the linear laser beam 5, a beam such as the following is selected: a beam emitted from a continuous wave laser (hereinafter also referred to as a CW laser) or a quasi-continuous wave laser (hereinafter also referred to as a quasi-CW laser) which has an output of approximately several tens to several hundreds of watts, has a wavelength in the visible light to ultraviolet light range, and is a single mode beam or can be regarded as a single mode beam. A beam spot of such a laser beam is shaped into a linear form by an optical system which includes a cylindrical lens or the like. For example, when a beam spot before shaping is circular and has a diameter of 2 mm, by shaping with a cylindrical lens for which focal length f=20 mm, a linear beam spot with a minor axis direction length of approximately 10 μm can be formed.

Further, the present inventors found through their research that the crystal structure of a crystalline semiconductor film obtained by crystallization with laser beam irradiation is determined by energy of the laser beam. The relationship between the energy of a laser beam and crystal structure will be described with reference to FIG. 23. When an energy E of a laser beam is lower than $E_0$, melting does not take place, so a crystal structure does not change. As the energy E becomes higher than $E_0$, crystal grains of a crystalline semiconductor become larger. When the energy E is greater than or equal to $E_0$ and less than $E_1$, microcrystals are formed; when the energy E is greater than or equal to $E_1$ and less than $E_2$, small grain crystals are formed; and when the energy E is greater than or equal to $E_2$ and less than $E_4$, large grain crystals are formed. When the energy E is greater than or equal to $E_4$, the semiconductor film ablates or splits.

It was found that in order to grow large grain crystals, it is necessary for the energy E of the laser beam to be greater than or equal to the energy $E_2$ at which a semiconductor film is melted completely. Further, it was found that in the energy E range $E_2 \leq E < E_4$ at which the semiconductor film is melted completely and large grain crystals are obtained, there is an energy E range $E_2 \leq E < E_3$ at which a crystalline semiconductor in which the crystal plane orientations of each crystal grain are aligned can be formed.

Note that a film being melted completely refers to a state where a film is melted from a top surface to an interface with a surface over which the film was formed; that is, to where the film is in a liquid state.

FIG. 22 shows the crystalline semiconductor 6 having large grain crystals which is formed by irradiation with the linear laser beam 5. When a beam emitted from a continuous wave laser or a quasi-continuous wave laser is selected as the linear laser beam 5, a solid-liquid interface moves in a scanning direction of the linear laser beam 5 and crystals grow laterally. As a result, the crystalline semiconductor 6 formed of large grain crystals which are long in the scanning direction can be formed. Note that the dotted lines of the crystalline semiconductor 6 in FIG. 22 indicate grain boundaries.

Through the research of the present inventors, it was found that in order to form a crystalline semiconductor in which crystal plane orientations are aligned using laser beam irradiation, it is necessary to optimize a beam profile of a laser beam such that an amount of heat applied to an amorphous silicon film is the minimum required, so that the formation of more crystal nuclei than necessary in a semiconductor which is melted completely is suppressed. A cap film has an effect of suppressing reduction in viscosity of melted amorphous silicon, an antireflection effect, a thermal storage effect, and the like; therefore, providing a cap film is considered effective for optimizing the amount of heat applied to an amorphous silicon film.

However, concerning single mode laser beams, because a beam profile of a single mode laser beam at the time of emission from a laser has a Gaussian distribution; output of lasers in practical use is low; and so on, the range of output of a laser at which a crystalline semiconductor film in which plane orientations of crystals are aligned is formed is very small, so it is difficult to form such crystalline semiconductors with a high yield.

The present invention was developed as a result of the research up till now of the present inventors. An object of the present invention is to provide a method of forming crystalline semiconductors in which plane orientations of crystals are aligned with a high yield.

As described with reference to FIG. 22, by irradiating with a laser beam so as to completely melt an object of irradiation and growing a semiconductor film laterally, large grain crystals which have grain boundaries which extend in a scanning direction of the laser beam can be formed. Through the research of the present inventors, it was found that the larger the width of a linear laser beam is, the more orientations of large grain crystals become disordered.

Therefore, the present inventors reached the view that a cause of plane orientations of adjacent crystal grains not being aligned is that turbulent flow occurs in a semiconductor which is in a liquid state. This is because when turbulent flow occurs in a semiconductor film which is melted, the orientation which crystal grains tend to take differs depending on the place; therefore, when the semiconductor film solidifies, crystal grains have differing orientations. The wider a linear laser beam is, the larger a completely melted region is, so turbulent flow easily occurs in the melted region of the semiconductor. Accordingly, plane orientations of adjacent crystal grains differ.

The present invention was derived from such knowledge. In the present invention, the width of a linear laser beam (the length of a minor axis direction of the linear laser beam) is decreased so that the occurrence of turbulent flow in a region of a semiconductor which is completely melted is prevented. The present invention is a method of crystallizing a semiconductor film by forming a non-single-crystal semiconductor film over a substrate, and irradiating the non-single-crystal semiconductor film with a linear laser beam and completely melting the non-single-crystal semiconductor film, while scanning the linear laser beam, to form a crystalline semiconductor. In the invention, the width of the linear laser beam on a surface which is irradiated is less than 2 μm, and thus the occurrence of turbulent flow in melted semiconductor is prevented and disorderly crystal growth within a region irradiated by the laser beam is suppressed. Therefore, orientations of adjacent crystal grains are aligned.

In the invention, by having the width of the linear laser beam be less than 2 μm, the occurrence of turbulent flow in melted semiconductor film is suppressed and crystalline semiconductor films in which plane orientations of crystals are aligned are formed with a good yield. Further, the width of the linear laser beam is in the range of greater than or equal to 0.2 μm and less than 2 μm.

Further, in the case where a cap film is formed over an upper surface of the non-single-crystal semiconductor film, as shown in FIG. 22, because the cap film has an effect of suppressing the occurrence of turbulent flow in melted semiconductor film, the width of the linear laser beam may be increased to 2.0 μm or more, and the upper limit of the width of the linear laser beam can be 5 μm.

The form of a laser beam being linear refers to the form being long and narrow and the aspect ratio of a beam spot on the surface of the object which is irradiated (length of major axis/length of minor axis) being greater than or equal to ten. The line does not have to be an ideal line; for example, it may be elliptical. The width of the linear laser beam on the surface of the object which is irradiated refers to the length of the minor axis of the beam spot on the surface of the object to be irradiated, and the length of the linear laser beam refers to the length of the major axis of the beam spot on the surface of the object to be irradiated.

Further, the width of a linear laser beam can be determined by the width of a crystal grain of the formed crystalline semiconductor. In the invention, the width of the linear laser beam is approximately equal to or less than the width of a crystal grain, and thus the occurrence of turbulent flow in melted semiconductor is prevented and disordered crystal growth in a region irradiated by the laser beam is suppressed; therefore, the crystal plane orientations of adjacent crystal grains are aligned.

Note that the width of a crystal grain of the crystalline semiconductor refers to the length of the crystal grain in the major axis direction of the linear laser beam, and is an interval between grain boundaries in that direction. The length of a crystal grain refers to the length of the crystal grain in a scanning direction of the linear laser beam, and is the length of the crystal grain in the minor axis direction of the linear laser beam. The width and length of a crystal grain can be found by observing a crystalline semiconductor film with an optical microscope or an electron microscope. Further, the width and length of a crystal grain can be found from an electron backscatter diffraction pattern (EBSP) of the crystalline semiconductor film.

In the invention, preferably an aspheric cylindrical lens is used as a condensing lens for narrowing the width of the linear laser beam. By suppressing spherical aberration using an aspheric cylindrical lens, the linear laser beam can be condensed very narrowly in a width direction. Further, a gradient index lens, which has a similar function to an aspheric cylindrical lens, can be used instead of an aspheric cylindrical lens. Note that a gradient index lens is also referred to as a GRIN lens.

The crystal structure of the semiconductor film which is irradiated by the laser beam is non-single-crystal. For example, the crystal structure is amorphous, microcrystalline, or polycrystalline. The semiconductor film is typically a semiconductor film which contains silicon as a main component, or a film which contains germanium as a main component; for example, the semiconductor film is a silicon film, a compound film containing silicon and germanium ($Si_{1-x}Ge_x$), or a silicon carbide (SiC) film. Such semiconductor films can be formed by a CVD method or a sputtering method. Further, an n-type impurity such as phosphorus (P), arsenic (As), or the like, or a p-type impurity such as boron (B) may be included in the semiconductor film. Before crystallization, the thickness of the semiconductor film is in the range of 10 to 200 nm.

A wavelength of the laser beam can be in the range of 250 to 600 nm. In the case where a light absorption layer, such as a metal layer, which absorbs the laser beam as heat, is formed over or under the semiconductor film, the wavelength can be in the range of 250 nm to 1.2 μm. Further, as the laser beam, a fundamental wave of a laser can be used. Alternatively, a harmonic of a laser (typically, a second harmonic or a third harmonic) can be used.

A transverse single mode is preferable for the laser beam, because when a transverse single mode is used rather than a multimode, it is easier to homogenize a beam profile of the laser beam and to narrow down the beam spot.

A laser which emits the laser beam may be any one of a continuous wave laser, a quasi-continuous wave laser, or a pulsed laser. In the case of using a pulsed laser, regions of the semiconductor which are irradiated by the linear laser beam are connected so that completely melted semiconductor grows laterally.

A laser used in the invention is, for example, an excimer laser, such as a KrF laser or the like; or a gas laser, such as an Ar laser, a Kr laser, or the like. Alternatively, as a solid-state laser, a YAG laser, a $YVO_4$ laser, a YLF laser, a $YAlO_3$ laser, a $GdVO_4$ laser, a KGW laser, a KYW laser, an alexandrite laser, a Ti:sapphire laser, a $Y_2O_3$ laser, or the like may be used. Note that an excimer laser is a pulsed laser; however, among solid-state lasers such as YAG lasers and the like, there are lasers which may be continuous wave lasers, quasi-continuous wave lasers, and pulsed lasers.

By decreasing the width of the linear laser beam, the occurrence of turbulent flow in melted semiconductor can be suppressed. Therefore, crystalline semiconductors in which plane orientations of crystals are aligned can be formed with a high yield.

When the crystalline semiconductor in which plane orientations of crystals are aligned is used for a channel forming region, a semiconductor element having superior electrical characteristics, such as high field-effect mobility and a low subthreshold swing, can be formed. Further, a plurality of semiconductor elements which have superior, uniform electrical characteristics can be formed over the same substrate.

When an aspheric cylindrical lens or a gradient index lens is used to decrease the width of the linear laser beam, an optical system which emits the linear laser beam can have a very simple structure.

BRIEF DESCRIPTION OF THE DRAWINGS

FIGS. 5A to 5D are cross-sectional views showing a method of manufacturing a semiconductor device of the invention. They show a method of manufacturing an active matrix liquid crystal display device.

FIGS. 6A to 6C are cross-sectional views showing process steps which follow on from those of FIG. 5D.

FIGS. 7A to 7C are cross-sectional views showing a method of manufacturing a semiconductor device of the invention. They show a method of manufacturing an active matrix light-emitting device.

FIGS. 5A to 8F are outline views of electronic devices which include a semiconductor device of the invention in a display portion. FIG. 8A shows a portable information terminal; FIG. 8B shows a digital video camera; FIG. 8C shows a portable telephone; FIG. 8D shows a portable television device; FIG. 8E shows a portable computer; and FIG. 8F shows a television device.

FIG. 17 shows a software window of software used for designing a rotationally symmetrical aspheric lens. The software window shows lens data.

DETAILED DESCRIPTION OF THE INVENTION

Hereinafter, a method of crystallizing a semiconductor film of the invention and a method of manufacturing a semiconductor device of the invention will be described with reference to the accompanying drawings. However, the invention can be carried out in many different modes, and those skilled in the art will readily appreciate that a variety of modifications can be made to the modes and their details without departing from the spirit and scope of the invention. Accordingly, the invention should not be construed as being limited to the description of the embodiment modes below.

[Embodiment Mode 1]

Figure 1A:
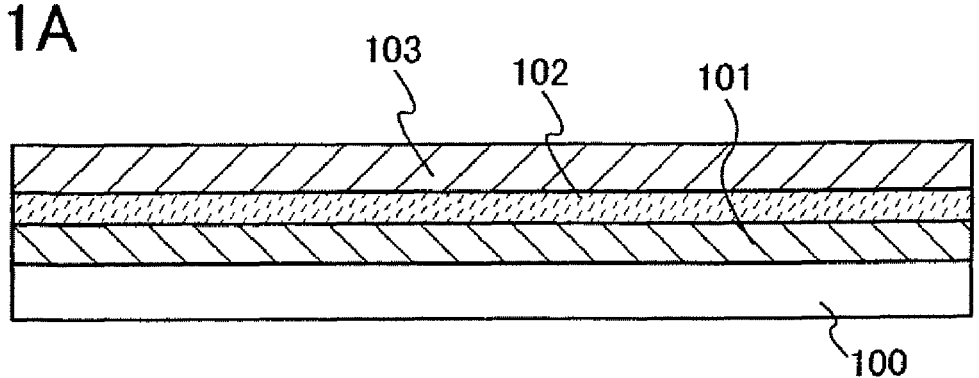
FIGS. 1A to 1C are cross-sectional views showing a method of crystallizing a semiconductor film of the invention.
Figure 1B:
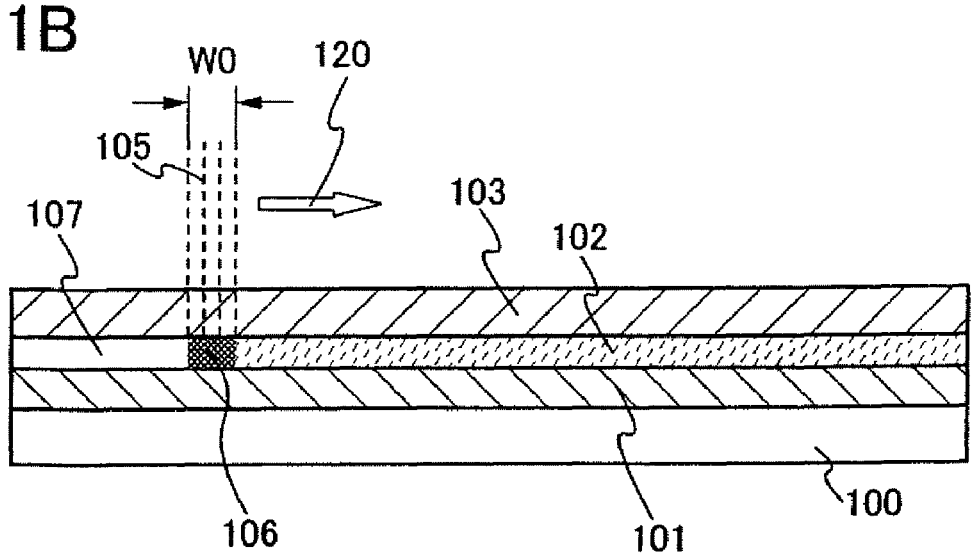
Figure 1C:
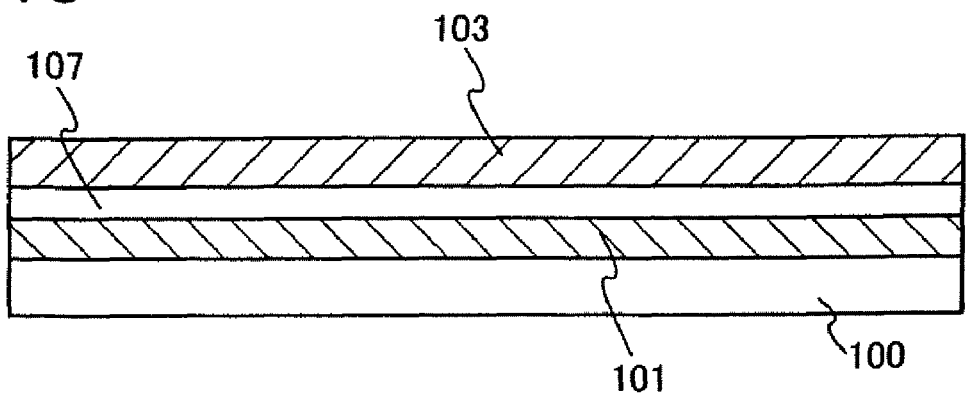

In this embodiment mode, a method of crystallizing a non-single-crystal semiconductor film and a method of manufacturing a semiconductor device using the crystallized semiconductor film will be described. FIGS. 1A to 1C are cross-sectional views showing a method of crystallizing a non-single-crystal semiconductor film of the invention.

First, as shown in FIG. 1A, a substrate 100 is prepared. As the substrate 100, a substrate formed using an insulating material, such as a glass substrate, a quartz substrate, a sapphire substrate, or a resin substrate; a conductive substrate, such as a stainless steel substrate; a semiconductor substrate; or the like can be used, for example. Note that a substrate formed using plastic, typified by a substrate formed using PET (polyethylene terephthalate), PEN (polyethylene naphthalate), PES (polyethersulfone), or polypropylene, or a substrate formed using a synthetic resin, typified by a substrate formed using an acrylic resin, can be used in the case where the substrate can withstand heating temperatures in a semiconductor device manufacturing process.

In the case where a conductive substrate, such as a stainless steel substrate or the like, or a semiconductor substrate is used, an insulating film which serves as a base film may be formed over a surface of the substrate, and a semiconductor film may be formed over the insulating film. Further, in the case where a substrate containing a material that may contaminate a semiconductor film, such as a glass substrate or a resin substrate, is used, preferably a surface of the substrate is covered with an insulating film which serves as a base film, so that the semiconductor film is not contaminated. Further, when the insulating film is formed thickly, there is an effect wherein it is difficult for heat to be conducted to the substrate, and therefore a substrate with low heat-resistance, such as a glass substrate or a plastic substrate, can be used. As the insulating film formed over the surface of the substrate, a single-layer film or a stacked-layer film which includes silicon oxide ($SiO_x$), silicon nitride ($SiN_x$) silicon oxynitride ($SiO_xN_y$, where x>y>0), silicon nitride oxide ($SiO_xN_y$, where 0<x<y), or the like can be used. Such insulating films can be formed by a CVD method or a sputtering method.

In this embodiment mode, a glass substrate is used as the substrate 100, and an insulating film 101 which serves as a base film is formed to a thickness of 50 to 300 nm over a surface of the substrate 100. For example, as the insulating film 101, a stacked-layer film which includes a silicon nitride oxide film with a thickness of 50 to 150 nm and a silicon oxynitride film with a thickness of 50 to 150 nm is formed by a CVD method. In this case, preferably the films are formed such that the silicon nitride oxide film, which is a lower layer, has a higher nitrogen content than the silicon oxynitride film, which is an upper layer. When a larger amount of nitrogen is included in the silicon nitride oxide film, which is a lower layer, an effect of preventing contamination (a passivation effect) is increased; and when the amount of nitrogen included in the silicon oxynitride film, which is an upper layer, is suppressed, interface state density with a crystalline semiconductor film is prevented from being high. Note that a silicon nitride film can be formed instead of the silicon nitride oxide film which is a lower layer. Further, a silicon oxide film can be formed instead of the silicon oxynitride film which is an upper layer.

Next, a semiconductor film 102 which is to be crystallized is formed over the insulating film 101. As the semiconductor film 102, a semiconductor containing silicon or germanium as a main component can be formed. For example, a semiconductor such as silicon, germanium, silicon germanium ($Si_{1-x}Ge_x$, where 0<x<1), silicon carbide (SiC), or the like can be used. A film formed of such a semiconductor can be formed by a CVD method or a sputtering method. Further, an n-type impurity such as phosphorus (P) or arsenic (As) or a p-type impurity such as boron (B) may be included in the semiconductor film 102.

The crystal structure of the semiconductor film 102 before it is irradiated with a laser beam is a non-single-crystal structure. For example, the crystal structure may be amorphous, microcrystalline, or polycrystalline.

The thickness of the semiconductor film 102 can be greater than or equal to 5 nm and less than or equal to 200 nm. The thickness of the semiconductor film 102 is preferably greater than or equal to 10 nm and less than or equal to 100 nm; more preferably, greater than or equal to 10 nm and less than or equal to 80 nm.

Note that the insulating film 101 which serves as a base film may be provided as necessary. In the case where the substrate 100 is glass, the insulating film 101 which serves as a base film prevents impurities from the glass from diffusing into the semiconductor film 102; however, in the case where a quartz substrate is used as the substrate 100, it is not necessary to provide the insulating film 101 which serves as a base film. Further, a separation layer can be provided between the insulating film 101 and the substrate 100, and subsequent to forming a semiconductor element or the like over the substrate 100, separation can be caused in the separation film, and the semiconductor element can be separated from the substrate 100.

Next, a cap film 103 is formed over the semiconductor film 102. As the cap film 103, preferably a film which has sufficient transmittivity with respect to a wavelength of the laser beam, whose physical property values, such as its thermal expansion coefficient and its elastic modulus, are similar to those of the semiconductor film 102 is used. For example, as the cap film 103, a single layer or stacked layer insulating film formed using any of silicon oxide ($SiO_x$), silicon nitride ($SiN_x$), silicon oxynitride ($SiO_xN_y$, where x>y>0), and silicon nitride oxide ($SiO_xN_y$, where 0<x<y) can be used. In the case where the cap film 103 is a stacked layer film, the effect of interference of light, caused by thin films, can be used to increase the light absorption efficiency of the semiconductor film 102. The laser beam can be efficiently absorbed when a cap film 103 with such a stacked layer structure is used. Therefore, the usable output range of the laser can be increased.

It is considered that the cap film 103 has an effect of suppressing the occurrence of turbulent flow in a region of the semiconductor film 102 which is completely melted, due to effects which the cap film 103 has such as an effect of suppressing reduction in viscosity of a region of the semiconductor film 102 which is completely melted, a thermal storage effect, and the like. In order to obtain an effect of suppressing turbulent flow, the thickness of the cap film 103 is greater than or equal to 100 nm and less than or equal to 1000 nm; preferably, greater than or equal to 200 nm and less than or equal to 600 nm.

In the case where an insulating film formed of an above-mentioned material, such as silicon oxide, is used as the cap film 103, preferably the insulating film has hardness and denseness similar to a gate insulating film. Such a hard, dense insulating film can be formed by reducing the speed of film formation, for example. Film formation speed is greater than or equal to 1 nm/min and less than or equal to 400 nm/min; preferably, greater than or equal to 1 nm/min and less than or equal to 100 nm/min.

Next, as shown in FIG. 1B, while scanning a linear laser beam 105, the semiconductor film 102 is irradiated with the linear laser beam 105 through the cap film 103. Note that the arrow 120 indicates a scanning direction of the linear laser beam 105. A portion in the semiconductor film 102 which is irradiated by the linear laser beam 105 is completely melted, and becomes a semiconductor 106 which is in a liquid state. When the linear laser beam 105 moves relative to the substrate, the portion of the semiconductor film 102 which until then was in a melted state cools and becomes solid. As a result, a crystalline semiconductor 107 is formed, as shown in FIG. 1C.

Figure 2:
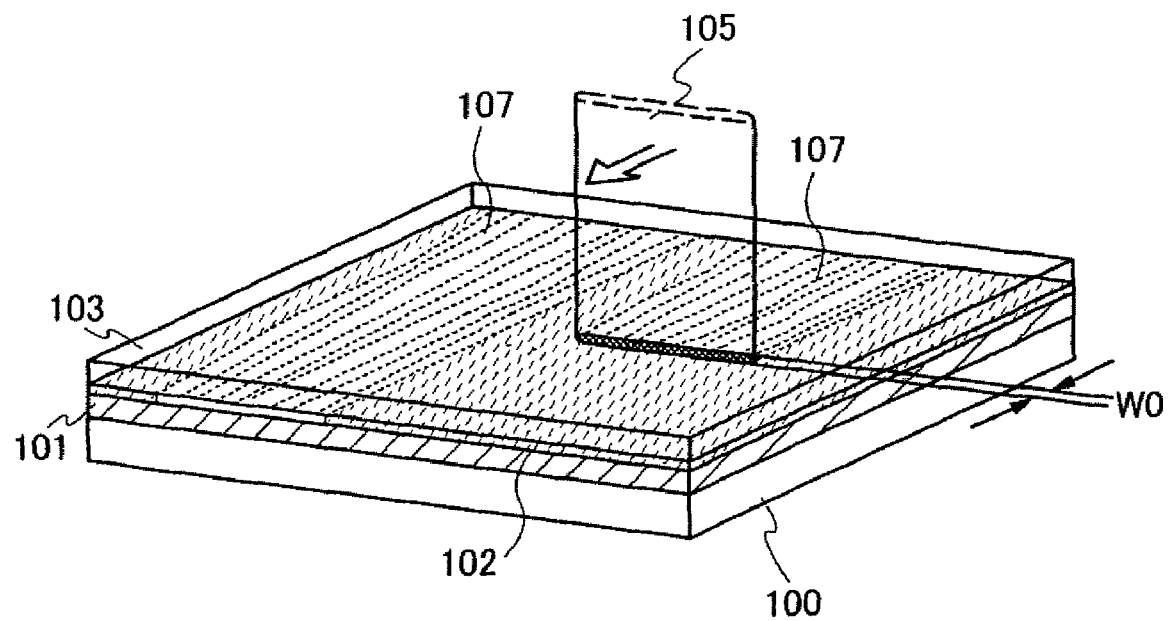
FIG. 2 is a perspective view which corresponds to FIG. 1B.

FIG. 2 shows a perspective view which corresponds to the cross-sectional view in FIG. 1B. When the linear laser beam 105 is scanned, a solid-liquid interface moves through the semiconductor film 102 in a scanning direction. Therefore, crystals grow laterally in the scanning direction of the linear laser beam 105, and as shown in FIG. 2, the crystalline semiconductor 107 formed of a plurality of crystals with a large grain diameter which are long in the scanning direction is formed. As a result, a plurality of grain boundaries which are in alignment with the scanning direction are formed in the crystalline semiconductor 107. The width of the crystal grains (the interval between grain boundaries) is determined by the period of time it takes the semiconductor 106 which is in a liquid state to cool and solidify, and is greater than or equal to 0.01 μm and less than or equal to 10 μm.

The invention is a method of crystallization in which by narrowing the width $W_0$ of the linear laser beam 105, the occurrence of a temperature gradient in the semiconductor 106 which is in a liquid state is suppressed, and thus the occurrence of turbulent flow in the semiconductor 106 which is in a liquid state is suppressed. By preventing turbulent flow from occurring in the semiconductor 106 which is in a liquid state, the growth direction, growth distance, and the like of adjacent crystal grains is made uniform; and as a result, the crystal plane orientations of each crystal grain of the crystalline semiconductor 107 can be aligned.

Accordingly, in the invention, in order to prevent turbulent flow from occurring in a semiconductor which is completely melted by the linear laser beam 105, it is preferable that the width $W_0$ of the linear laser beam 105 on a surface which is irradiated is similar to the width of a crystal grain (the interval between grain boundaries) of the crystalline semiconductor 107. In the crystallization method shown in FIGS. 1A to 1C, since the cap film 103 has the effect of suppressing turbulent flow, an acceptable width $W_0$ of the linear laser beam 105 may be a width of not more than 5 μm. The width $W_0$ of the linear laser beam 105 is preferably in the range of greater than or equal to 0.2 μm and less than or equal to 5 μm; more preferably, greater than or equal to 0.2 μm and less than 2 μm.

In the invention, the semiconductor film 102 can be made to grow laterally by irradiation with the linear laser beam 105, without including a process step of forming the cap film 103. In that case, in order to suppress the occurrence of turbulent flow in a region of the semiconductor film 102 which is completely melted, the width $W_0$ of the linear laser beam 105 preferably does not exceed 2 μm. Preferably, the width $W_0$ is greater than or equal to 0.2 μm and less than 2 μm. When the width $W_0$ of the linear laser beam 105 is a very thin width of less than 2 μm the range of the output of a laser which can completely melt the semiconductor film increases, and the yield of laterally grown crystalline semiconductors can be improved. Further, since the occurrence of turbulent flow in completely melted semiconductor is suppressed, crystal plane orientations of the crystallized semiconductor can be aligned.

Figure 3:
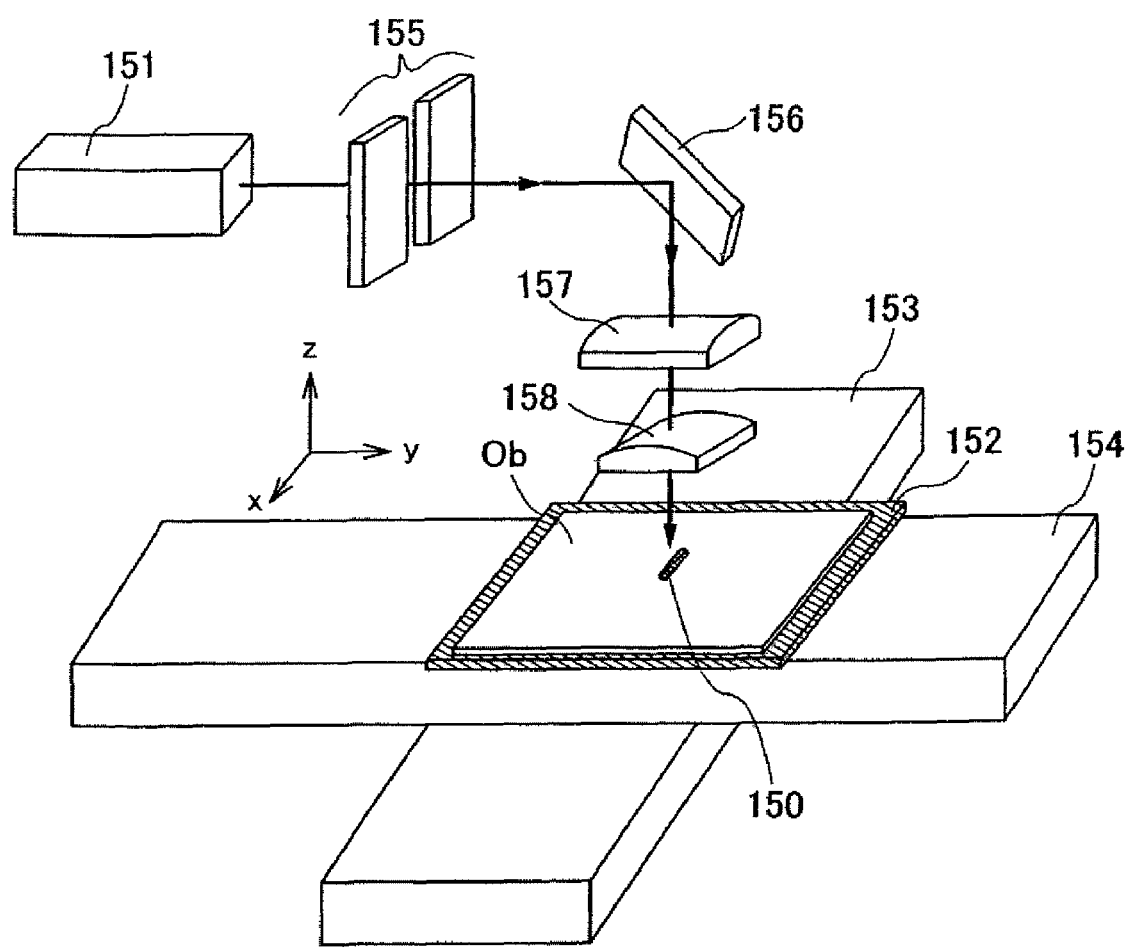
FIG. 3 shows a structure of a laser irradiation apparatus used in a method of crystallizing a semiconductor film of the invention.

A structure of a laser irradiation apparatus for irradiation with a linear laser beam having a width of less than or equal to 5 μm will now be described with reference to FIG. 3. FIG. 3 shows a structural example of a laser irradiation apparatus of the invention. In FIG. 3, an x direction is a major axis direction of a linear laser beam, and to crystallize a semiconductor film, the linear laser beam is scanned in a y direction.

As shown in FIG. 3, the laser irradiation apparatus includes a laser 151 which emits a laser beam, a stage 152 for firmly fixing a substrate, an X stage 153, and a Y stage 154. For the laser 151, a single mode (more specifically, a single transverse mode $TEM_{00}$) laser or a laser with a mode which is similar to that is more suited to crystallizing a semiconductor than a multimode laser, because the beam profile of a single mode laser has a Gaussian distribution and is easier to control than that of a multimode laser.

As the laser 151, any of a CW laser, a quasi-CW laser, and a pulsed laser can be used. As the laser 151, for example, as a gas laser, an excimer laser such as a KrF laser, an Ar laser, a Kr laser, or the like can be used. Alternatively, as a solid-state laser, a YAG laser, a $YVO_4$ laser, a YLF laser, a $YAlO_3$ laser, a $GdVO_4$ laser, a KGW laser, a KYW laser, an alexandrite laser, a Ti:sapphire laser, a $Y_2O_3$ laser, or the like can be used.

In the case where a harmonic of a beam emitted from a laser medium of the laser 151 is used, a nonlinear optical element which converts a fundamental wave of the laser 151 into a harmonic is used. The nonlinear optical element may be included in the laser 151 or may be included in the laser irradiation apparatus as a component which is independent of the laser 151.

The stage 152 for firmly fixing a substrate is a device which employs suction to firmly fix an object Ob to be processed which is to be irradiated with a linear laser beam. The stage 152 for firmly fixing a substrate is moved in the x direction by the X stage 153 and in the y direction by the Y stage 154. When the object Ob to be irradiated is moved by the X stage 153 and the Y stage 154, a beam spot 150 of the linear laser beam on a surface, which is irradiated, of the object Ob to be processed is scanned in an xy plane.

Note that although the laser irradiation apparatus in FIG. 3 has a structure where the beam spot 150 is fixed and the linear laser beam is scanned by moving the object Ob to be processed using the X stage 153 and the Y stage 154, a structure in which the linear laser beam is scanned by fixing the object Oh to be processed and moving the beam spot 150, or a structure in which both these structures are combined, may also be used.

An optical system of the laser irradiation apparatus in FIG. 3 includes a slit 155, a deflecting mirror 156, a projection lens 157, and a condensing lens 158, which are disposed in that order from an emission side of the laser 151.

The deflecting mirror 156 is disposed as appropriate in a place where it is necessary for an optical path to be deflected. Therefore, the position and number of the deflecting mirror 156 are not limited to those in FIG. 3. Further, the deflecting mirror 156 is not necessarily provided.

The slit 155 is an optical element for homogenizing a beam profile of a laser beam. The slit 155 is disposed such that both x direction-ends of the linear laser beam of the beam spot 150 are blocked. The beam profile of a single mode laser beam has a Gaussian distribution, and end portions of the beam have an intensity which is insufficient to completely melt a semiconductor. The laser beam is passed through the slit 155 so that the object Ob to be processed is not irradiated by portions of the laser beam which have a weak intensity. Note that in the case where it is permissible for crystals with a small grain diameter or microcrystals to be formed at ends of a region irradiated by the laser beam, the slit 155 does not have to be provided.

The projection lens 157 is a lens for projecting an image of the slit 155 onto the object Ob to be irradiated. Therefore, the projection lens 157 is disposed such that the slit 155 has a conjugate relationship with the surface to be irradiated. In the laser irradiation apparatus in FIG. 3, a convex cylindrical lens is used as the projection lens 157, and this cylindrical lens is disposed such that the beam spot 150 is condensed in the x direction. A convex spherical lens may be used instead of the convex cylindrical lens. Note that the projection lens 157 can be disposed on an emission side of the condensing lens 158, and the projection lens 157 may be omitted from the structure.

The condensing lens 158 is a lens for condensing the beam spot 150 in a width direction and processing the beam spot 150 so that it has a linear form with a width of less than or equal to 5 μm. In the laser irradiation apparatus in FIG. 3, a convex aspheric cylindrical lens is used as the condensing lens 158, and this aspheric cylindrical lens is disposed such that the beam spot 150 is condensed in the y direction. When an aspheric cylindrical lens is used, a linear laser beam with a width of less than or equal to 5 μm, which is difficult to form with a conventional cylindrical lens, can be formed. Further, a very narrow linear laser beam with a width of less than 2 μm can be formed. Later, how a very narrow linear laser beam can be formed with an aspheric cylindrical lens will be described.

As described above, optical elements other than the condensing lens 158 can be provided as necessary. It is possible for the laser irradiation apparatus in FIG. 3 to be an optical system with a very simple structure which includes only the condensing lens 158.

Note that in the optical system shown in FIG. 3, in the case where the focal depth of the condensing lens 158 is less than a vertical interval of an uneven portion (surface roughness) of the surface of the object Ob to be processed, the laser irradiation apparatus is provided with an autofocus device so that the focal position of the condensing lens 158 can be adjusted while the linear laser beam is being scanned. Adjustment of the focal position of the condensing lens 158 can be performed by moving the position of the condensing lens 158 (in the case of the structure in FIG. 3, by moving the condensing lens 158 in a z direction), or by moving the stage 152 for firmly fixing a substrate up and down (in the z axial direction). The object which is moved is lighter in the case of a device with an operating structure in which the condensing lens 158 is moved; therefore, such a device is preferable as an autofocus device.

To crystallize a semiconductor film using the laser irradiation apparatus in FIG. 3, the substrate 100 shown in FIG. 1A, over which the insulating film 101, the semiconductor film 102, and the cap film 103 are formed, is fixed to the stage 152 for firmly fixing a substrate, as the object Ob to be processed. By moving the substrate 100, the semiconductor film 102 can be irradiated with the linear laser beam while the linear laser beam is scanned. Scanning speed can be determined by taking into consideration an emission method employed by the laser 151, output of the laser 151, material and thickness of the semiconductor film 102, the presence or otherwise of the cap film 103, the structure and thickness of the cap film 103, and the like. Particularly in the case where a pulsed laser is used as the laser 151, the scanning speed is controlled such that irradiation regions of the linear laser beam are overlapped in the scanning direction and the semiconductor film 102 grows laterally.

When the linear laser beam has been scanned for a predetermined distance in the y direction from one side of the substrate 100 to a side opposite that side, the substrate 100 is moved by the X stage 153 in the x direction by the length of the linear laser beam or more than the length of the linear laser beam, and alignment is performed such that a portion of the semiconductor film 102 which has not yet been crystallized is irradiated by the beam spot 150. Again, irradiation is performed with the linear laser beam while the substrate 100 is moved in the y direction by the Y stage 154. By repeating the above series of operations, a desired portion of the semiconductor film 102 can be crystallized to form the crystalline semiconductor 107.

Next, a method of manufacturing a semiconductor device using the crystalline semiconductor 107 formed using the crystallization method of the invention will be described with reference to FIGS. 4A to 4D.

Figure 4A:
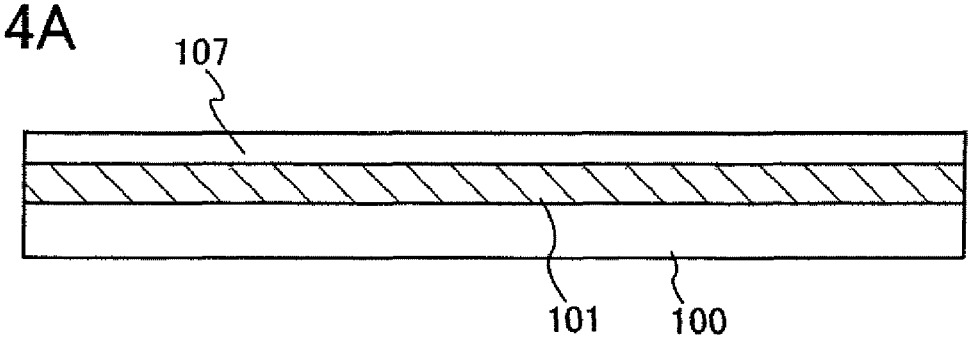
FIGS. 4A to 4D are cross-sectional views showing a method of manufacturing thin film transistors using a crystalline semiconductor film formed using the invention.

By completing the crystallization process, the crystalline semiconductor 107 is formed over the substrate 100, as shown in FIG. 1C. Next, in order to manufacture a semiconductor device, as shown in FIG. 4A, the cap film 103 is removed by etching.

Figure 4B:
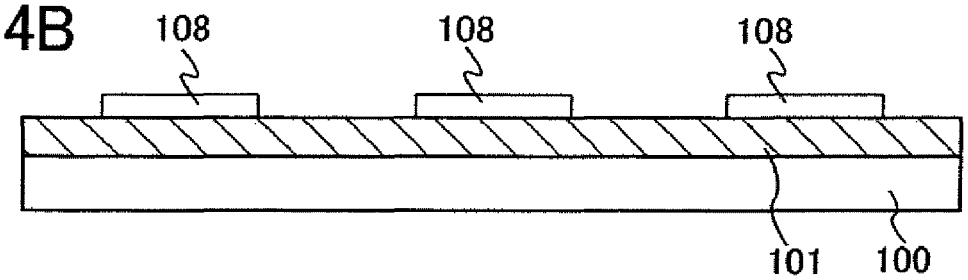

Next, a resist is applied over the crystalline semiconductor 107. The resist is exposed and developed to form a resist with a desired form. Etching is performed using this resist as a mask, to partially remove the crystalline semiconductor 107. Through this process, island-shaped crystalline semiconductor films 108 are formed over the insulating film 101, as shown in FIG. 4B. In order to protect the crystalline semiconductor 107 in which plane orientations of formed crystals are aligned, preferably a surface of the crystalline semiconductor 107 is oxidized before the resist is formed. This oxide film also has an effect of improving wettability of the resist. For the oxidation, for example, an aqueous solution containing ozone is applied, or treatment using ozone obtained by irradiation using UV in an oxygen atmosphere is employed.

The island-shaped crystalline semiconductor film 108 is used to form a semiconductor element included in a semiconductor device, such as a thin film transistor, a diode, a resistor, a capacitor, a photoelectric conversion element, a charge-coupled device, or the like. Here, as one mode of a method of manufacturing a semiconductor device, a thin film transistor (hereinafter abbreviated as 'TFR') is manufactured.

Note that in the case of manufacturing a TFT, before forming the resist which is used to form the island-shaped crystalline semiconductor films 108, the crystalline semiconductor 107 is doped with a very small amount of an impurity element (e.g., boron or phosphorus) in order to control a threshold voltage of the TFT. Note that the doping may be performed as necessary.

Figure 4C:
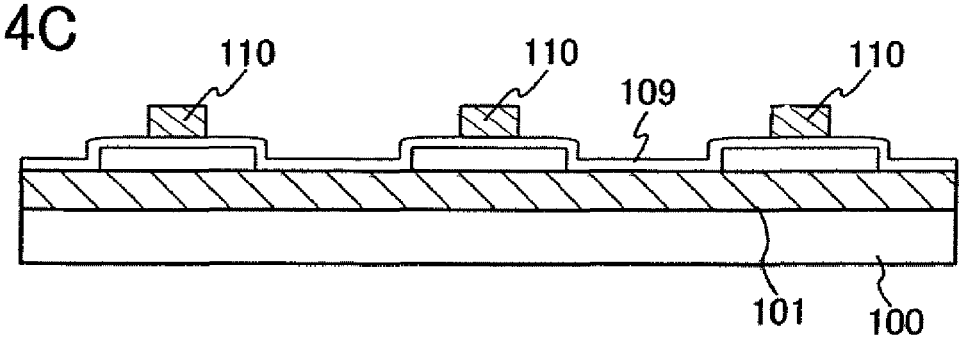

An insulating film 109 is formed over the crystalline semiconductor films 108, as shown in FIG. 4C. The insulating film 109 serves as a gate insulating film of the TFT. For example, a silicon oxide film is formed as the insulating film 109.

Next, a conductive film is formed over the insulating film 109. Preferably, any one of the refractory metals W, Mo, Ti, Ta, Co, and the like, which do not easily form hillocks, and a refractory metal compound, such as tungsten nitride, molybdenum nitride, titanium nitride, tantalum nitride, or the like, which do not easily form hillocks, are used for the conductive film. The conductive film may be a single layer or a stacked layer. The conductive film is processed into a desired form by using etching, to form gate wirings 110.

Next, using the resist which was used in the formation of the gate wirings 110 as a mask, the crystalline semiconductor films 108 are doped with an impurity element (P, As, or the like) which imparts a conductivity type. Here, in order to manufacture an n-channel TFT, an impurity element which imparts n-type conductivity, such as phosphorus or arsenic, is added to the crystalline semiconductor films 108 to form n-type impurity regions 112. The n-type impurity regions 112 each serve as a source region or a drain region. Note that in the case of manufacturing a p-channel TFT, an impurity element which imparts p-type conductivity, such as boron, is introduced.

By adding an impurity element which imparts a conductivity type to the crystalline semiconductor films 108, channel forming regions 113 are formed in regions of the crystalline semiconductor films 108 which overlap with the gate wirings 110.

Subsequent to adding the impurity element, a heat treatment or laser beam irradiation is performed in order to activate the impurity element. Through this process, at the same time as the impurity element is activated, plasma damage to the insulating film 109 and plasma damage which has occurred at an interface between the insulating film 109 and the crystalline semiconductor films 108 can be repaired.

Figure 4D:
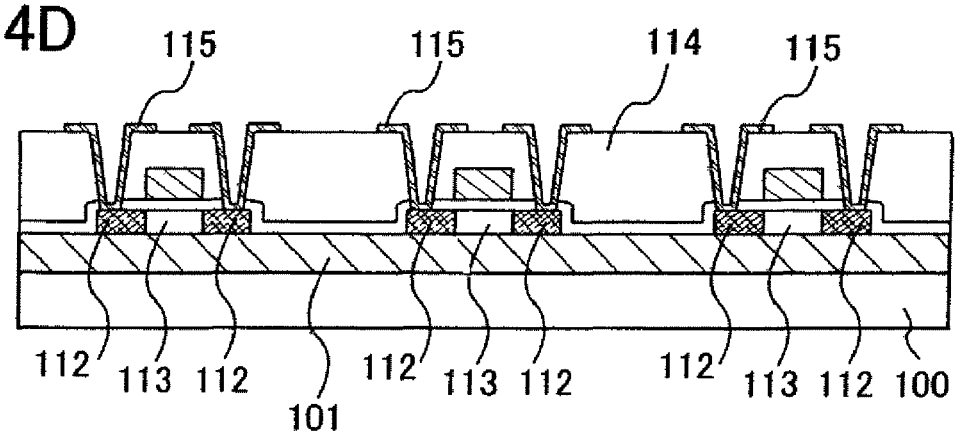

Next, an insulating film 114 is formed, as shown in FIG. 4D. Then, the insulating film 114 and the insulating film 109 are etched to form contact holes which reach the n-type impurity regions 112. A conductive film is formed over the insulating film 114. The conductive film is processed into a desired form by etching, to form wirings 115. Here, the wirings 115 each serve as a source wiring or a drain wiring.

A conductive film used to form the wirings 115 can be formed of any one of the metals W, Mo, Ti, Al, and Cu; or of any material which is an alloy or compound which contains any of those metals as a main component, for example. The conductive film may have a single layer or a plurality of layers. To form the conductive film as a film having a plurality of layers, a Ti film, an Al film, and another Ti film may be stacked in that order, for example.

Through the above-described process, TFTs are formed over the substrate 100, as shown in FIG. 4D. Because the crystalline semiconductor films 108 are crystalline semiconductor films in which crystal plane orientations are aligned with each other, variation in electrical characteristics of the plurality of TFTs over the substrate 100 can be suppressed. Further, TFTs with superior electrical characteristics, that is, with a low subthreshold swing, a high on-state current, and a high field-effect mobility, can be manufactured. Accordingly, an integrated circuit which has low power consumption and high-speed operation can be manufactured using such TFTs.

Various semiconductor devices can be manufactured using a crystalline semiconductor film formed using the crystallization method of the invention. In the embodiment modes below, methods of manufacturing various semiconductor devices will be described.

[Embodiment Mode 2]

In this embodiment mode, a method of manufacturing a liquid crystal display device, which is an example of a semiconductor device, will be described with reference to FIGS. 5A to 5D and FIGS. 6A to 6C.

As shown in FIG. 5A, similarly to in Embodiment Mode 1, the insulating film 101 which serves as a base film is formed over the substrate 100, the semiconductor film 102 with a non-single-crystal structure is formed over the insulating film 101, and the cap film 103 is formed over the semiconductor film 102.

Here, a glass substrate is used as the substrate 100. As the insulating film 101, silicon nitride oxide ($SiO_xN_y$, where $0<x<y$) with a thickness of 40 to 60 nm is formed by a plasma CVD method. Further, as the semiconductor film 102, an amorphous silicon film with a thickness of 10 to 80 nm is formed by a plasma CVD method, using $SiH_4$ and $H_2$ for a gas. As the cap film 103, silicon nitride oxide ($SiO_xN_y$, where $0<x<y$) with a thickness of 200 to 1000 nm is formed by a plasma CVD method. For example, by using $SiH_4$ (with a flow rate of 10 sccm), $NH_3$ (with a flow rate of 100 sccm), $N_2O$ (with a flow rate of 20 sccm), and $H_2$ (with a flow rate of 400 sccm) for the gas, a silicon nitride oxide film which contains less than or equal to ten atomic percent oxygen and has a nitrogen to silicon composition ratio of greater than or equal to 1.3 and less than or equal to 1.5 is formed.

Next, while the linear laser beam 105 is scanned, the semiconductor film 102 is irradiated with the linear laser beam 105 through the cap film 103, as shown in FIG. 5B. By irradiating with the linear laser beam 105, an irradiated region of the semiconductor film 102 is completely melted, and becomes the semiconductor 106, which is in a liquid state. When the linear laser beam 105 is scanned, completely melted regions of the semiconductor film 102 grow laterally, and thus the crystalline semiconductor 107 which is formed of crystals with a large grain diameter is formed over the insulating film 101. In the invention, by having the width of the linear laser beam 105 be less than or equal to 5 μm, the occurrence of turbulent flow in completely melted regions of the semiconductor film 102 is suppressed. Therefore, the crystalline semiconductor 107 can be formed as a crystalline semiconductor in which crystal plane orientations are aligned.

Note that in the case where hydrogen is included in the semiconductor film 102 or the cap film 103, in order to prevent effusion of hydrogen caused by the linear laser beam irradiation, before irradiation with the linear laser beam 105 is performed, a heat treatment is performed to lower hydrogen concentration.

After the crystalline semiconductor 107 is formed, the cap film 103 is removed. Various removal methods, such as dry etching, wet etching, polishing, or the like, can be used to remove the cap film 103. In this embodiment mode, the cap film 103 is removed by dry etching.

Next, the crystalline semiconductor 107 is selectively etched to form semiconductor layers 201 to 203, as shown in FIG. 5C. As a method for etching the crystalline semiconductor 107, dry etching, wet etching, or the like can be used. Here, a resist is applied over the crystalline semiconductor 107, and exposure and development are then performed to form a resist mask. Using the formed resist mask, the crystalline semiconductor 107 (crystalline silicon) is selectively etched by a dry etching method in which the $SF_6:O_2$ flow ratio is 4:15. Subsequently, the resist mask is removed.

Next, as shown in FIG. 5D, an insulating film 204 is formed over the semiconductor layers 201 to 203. The insulating film 204 serves as a gate insulating film of a thin film transistor. The insulating film 204 is formed as a single layer film or a stacked layer film, using silicon oxide ($SiO_x$), silicon nitride ($SiN_x$), silicon oxynitride ($SiO_xN_y$, where $x>y>0$), silicon nitride oxide ($SiO_xN_y$, where $0<x<y$), or the like. Here, as the insulating film 204, silicon oxynitride with a thickness of 115 nm is formed by a plasma CVD method.

Next, gate electrodes 205 to 208 are formed over the semiconductor layers 201 to 203 with the insulating film 204 interposed therebetween. The gate electrodes 205 to 208 can be formed using a metal, an alloy, a metal compound, or a polycrystalline semiconductor to which an impurity having one conductivity type has been added.

In the case where metal is used, tungsten (W), molybdenum (Mo), titanium (Ti), tantalum (Ta), aluminum (Al), or the like can be used. Further, a metal nitride formed by nitriding metal can be used. Alternatively, a structure in which a first layer formed of a metal nitride and a second layer formed of an above-mentioned metal are stacked may be employed. Such materials can be formed by a sputtering method, an evaporation method, or the like.

Further, the gate electrodes 205 to 208 can be formed by using a droplet discharge method to discharge a paste containing fine particles over the gate insulating film, then performing drying and baking. Alternatively, the gate electrodes 205 to 208 can be formed by printing a paste containing fine particles over the insulating film 204, drying the paste, and then baking the paste. Typical examples of fine particles which may be used include fine particles of gold, copper, an alloy of gold and silver, an alloy of gold and copper, an alloy of silver and copper, an alloy of gold, silver, and copper, and the like.

Here, a stacked layer film including a tantalum nitride film with a thickness of 30 nm and a tungsten film with a thickness of 370 nm is formed over the insulating film 204 by a sputtering method. Then, using a resist mask formed using a photolithography process, the stacked layer film is etched to form the gate electrodes 205 to 208 which each have a structure in which an end portion of the tantalum nitride film protrudes towards the outside more than an end portion of the tungsten film.

Next, using the gate electrodes 205 to 208 as a mask, an impurity element which imparts n-type conductivity or an impurity element which imparts p-type conductivity is added to the semiconductor layers 201 to 203 to form high-concentration impurity regions 209 to 215. Further, low-concentration impurity regions 216 to 223 which overlap with portions of the gate electrodes 205 to 208 are formed.

Note that here, the high-concentration impurity regions 209, 210, 213, 214, and 215 and the low-concentration impurity regions 216, 217, and 220 to 223 are doped with boron, which is an impurity element which imparts p-type conductivity. Further, the high-concentration impurity regions 211 and 212 and the low-concentration impurity regions 218 and 219 are doped with phosphorus, which is an impurity element which imparts n-type conductivity. By doping the semiconductor layers 201 to 203 with an impurity element, channel forming regions 201c to 203c are formed in a self-aligned manner.

Subsequently, a heat treatment is performed to activate the impurity element added to the semiconductor layers 201 to 203. Here, heating is performed for four hours in a nitrogen atmosphere at 550° C. Through the above-described process, thin film transistors 225 to 227 are formed.

Note that the thin film transistors 225 and 227 are p-channel thin film transistors and the thin film transistor 226 is an n-channel thin film transistor. The p-channel thin film transistor 225 and the n-channel thin film transistor 226 are included in a driver circuit, and the p-channel thin film transistor 227 serves as a switching element which applies voltage to an electrode of a pixel. Note that the thin film transistor 227 of the pixel may be an n-channel transistor. Here, both an n-channel and a p-channel transistor are included in the driver circuit; however, alternatively, a structure in which the driver circuit includes only n-channel transistors or only p-channel transistors can be employed.

Next, as shown in FIG. 6A, a first interlayer insulating film is formed over the thin film transistors 225 to 227. Here, the first interlayer insulating film is formed by stacking a silicon oxide film 231, a silicon nitride film 232, and a silicon oxide film 233.

Next, wirings 234 to 239, which are connected with the high-concentration impurity regions of the thin film transistors 225 to 227, and a connecting terminal 240 are formed over the silicon oxide film 233 which is a part of the first interlayer insulating film. Here, a stacked layer film is formed by forming a Ti film with a thickness of 100 nm, an Al film with a thickness of 700 nm, and another Ti film with a thickness of 100 nm consecutively by a sputtering method. Next, using a resist mask formed using a photolithography process, the stacked layer film is etched to form the wirings 234 to 239 and the connecting terminal 240.

Next, a second interlayer insulating film 241 is formed over the wirings 234 to 239 and the connecting terminal 240. The second interlayer insulating film 241 may be formed as a single layer film or a stacked layer film using an inorganic insulating material such as silicon oxide, silicon nitride, or silicon oxynitride (silicon oxide containing nitrogen or silicon nitride containing oxygen). As a method for forming a film of such an inorganic insulating material, a sputtering method, a LPCVD method, a plasma CVD method, or the like may be used.

Here, a plasma CVD method is used to form a silicon nitride film containing oxygen with a thickness of 100 to 150 nm. Then, using a resist mask formed using a photolithography process, the silicon nitride film containing oxygen is selectively etched to form the second interlayer insulating film 241, as well as contact holes which reach the wiring 239 of the thin film transistor 227 and the connecting terminal 240. Subsequently, the resist mask is removed. By forming the second interlayer insulating film 241, as described in this embodiment mode, exposure of TFTs of a driver circuit portion, the wirings, and the like can be prevented, and contamination can be avoided.

Next, a first pixel electrode 242, which is connected to the wiring 239 of the thin film transistor 227, and a conductive layer 244 which is connected to the connecting terminal 240 are formed. In a case where the liquid crystal display device is a transmissive liquid crystal display device, the first pixel electrode 242 is formed using a conductive film having a light-transmitting property. Further, in a case where the liquid crystal display device is a reflective liquid crystal display device, the first pixel electrode 242 is formed using a conductive film having a reflective property. Further, in a case where the liquid crystal display device is a semi-transmissive liquid crystal display device, part of the first pixel electrode 242 is formed using a conductive film having a light-transmitting property and a remaining part of the first pixel electrode 242 is formed using a conductive film having a reflective property.

Here, the liquid crystal display device is formed as a transmissive liquid crystal display device. A sputtering method is used to form ITO containing silicon oxide to a thickness of 125 nm. Using a resist mask formed by a photolithography process, the ITO film is etched to form the first pixel electrode 242 and the conductive layer 244.

Next, an insulating film 243 which serves as an alignment film is formed. Note that the alignment film may be formed as necessary. The insulating film 243 can be formed by using a roll coating method, a printing method, or the like to form a macromolecular compound layer which includes a polyimide, a polyvinyl alcohol, or the like, and then performing rubbing. Alternatively, the insulating film 243 can be formed by depositing SiO$_2$ obliquely with respect to the substrate. Further alternatively, the insulating film 243 can be formed by irradiating a photoreactive macromolecular compound with polarized UV light to polymerize the photoreactive macromolecular compound. Here, the insulating film 243 is formed by printing a macromolecular compound layer which includes a polyimide, a polyvinyl alcohol, or the like; performing baking; and then performing rubbing.

Next, as shown in FIG. 6B, a second pixel electrode 253 formed of a conductive film with a light-transmitting property is formed over a counter substrate 251, and an insulating film 254 which serves as an alignment film is formed over the second pixel electrode 253. As the counter substrate 251, materials similar to those which can be used for the substrate 100 can be selected as appropriate. Further, the second pixel electrode 253 can be formed in a similar manner to the first pixel electrode 242, and the insulating film 254 which serves as an alignment film can be formed in a similar manner to the insulating film 243. Note that a colored layer 252 which serves as a color filter may be provided between the counter substrate 251 and the second pixel electrode 253 if necessary.

In the case where color display is performed using a RGB method, as the colored layer 252, colored layers in which dyes or pigments corresponding to each of the colors red, green, and blue are dispersed are formed corresponding to each pixel.

Next, the substrate 100 and the counter substrate 251 are bonded together using a sealant 257, and a liquid crystal layer 255 is formed between the substrate 100 and the counter substrate 251. The liquid crystal layer 255 can be formed by using a vacuum injection method which utilizes capillarity to inject a liquid crystal material into a region enclosed by the insulating films 243 and 254 which serve as alignment films and the sealant 257. Alternatively, the liquid crystal layer 255 can be formed by forming the sealant 257 over one surface of the counter substrate 251, adding a liquid crystal material dropwise to a region surrounded by the sealant 257, and then using pressure bonding to bond the substrate 100 and the counter substrate 251 together under reduced pressure, and sealing a gap between the substrates with the sealant 257.

As the sealant 257, a thermosetting epoxy resin, a UV-curable acrylic resin, a thermoplastic nylon resin or polyester resin, or the like can be used. Note that in order to maintain the distance between the substrate 100 and the counter substrate 251, preferably a filler is included in the sealant 257.

Further, in order to maintain the distance between the substrate 100 and the counter substrate 251, spacers 256 may be provided between the insulating films 243 and 254 which serve as alignment films. The spacers 256 can be formed by applying an organic resin and etching the organic resin into a desired form; typically, a columnar form or a cylindrical form. Further, bead spacers may be used as the spacers 256. Here, bead spacers are used as the spacers 256. Further, one or both of the substrate 100 and the counter substrate 251 are provided with a polarizing plate, although this is not shown in the drawings.

Next, as shown in FIG. 6C, in a terminal portion 263, a connecting terminal which is connected to a gate wiring or a source wiring of a thin film transistor (in FIG. 6C, the connecting terminal 240 which is connected to a source wiring or a drain wiring is shown) is formed. An FPC (flexible printed circuit) 262 is connected to the connecting terminal 240 via the conductive layer 244 and an anisotropic conductive film 261. Video signals and clock signals are input to the connecting terminal 240 via the conductive layer 244 and the anisotropic conductive film 261.

A circuit which drives a pixel, such as a source driver or a gate driver, is formed in a driver circuit portion 264. Here, a CMOS circuit which includes the n-channel thin film transistor 226 and the p-channel thin film transistor 225 is formed.

A plurality of pixels is formed in a pixel portion 265, and liquid crystal elements 258 are formed in each pixel. The liquid crystal element 258 is a portion in which the first pixel electrode 242, the second pixel electrode 253, and the liquid crystal layer 255, which fills a gap between the first pixel electrode 242 and the second pixel electrode 253, overlap with each other. Further, the first pixel electrode 242 included in the liquid crystal element 258 is electrically connected to the thin film transistor 227.

Through the above-described process, the liquid crystal display device can be manufactured. In the liquid crystal display device described in this embodiment mode, in the semiconductor layers of the thin film transistors included in the driver circuit portion 264 and the pixel portion 265, plane orientations of crystals are aligned in a specific direction. Therefore, variation in the electrical characteristics of the plurality of thin film transistors can be suppressed; and as a result, a liquid crystal display device with no color unevenness or faults can be manufactured.

Further, because thin film transistors with superior electrical characteristics such as those described above can be formed, an active matrix liquid crystal display device with low power consumption and high resolution can be manufactured.

[Embodiment Mode 3]

In this embodiment mode, a manufacturing process of a light emitting device having a light emitting element which is an example of a semiconductor device will be described.

A crystalline semiconductor is formed over the substrate 100 with the insulating film 101 interposed therebetween, using similar process steps to those in Embodiment Mode 1. Then, as shown in FIG. 7A, the crystalline semiconductor is used to form the thin film transistors 225 to 227, using similar process steps to those in Embodiment Mode 2.

The silicon oxide film 231, the silicon nitride film 232, and the silicon oxide film 233 are stacked over the gate electrodes of the thin film transistors 225 to 227 to form a first interlayer insulating film. Further, wirings 308 to 313, which connect to the semiconductor layers of the thin film transistors 225 to 227, and a connecting terminal 314 are formed over the silicon oxide film 233, which is a part of the first interlayer insulating film.

Next, a second interlayer insulating film 315 is formed over the first interlayer insulating film, the wirings 308 to 313, and the connecting terminal 314. Subsequently, a first electrode layer 316, which connects to the wiring 313 of the thin film transistor 227, and a conductive layer 320 which connects to the connecting terminal 314 are formed. To form the first electrode layer 316 and the conductive layer 320, a sputtering method is used to form ITO containing silicon oxide to a thickness of 125 nm, and then the ITO containing silicon oxide is selectively etched, using a resist mask formed using a photolithography process. By forming the second interlayer insulating film 315, as described in this embodiment mode, exposure of TFTs of the driver circuit portion, wirings, and the like can be prevented, and the driver circuit can be protected from contaminants.

Next, an organic insulating film 317 which covers an end portion of the first electrode layer 316 is formed. Here, a photosensitive polyimide is applied and baked and then exposure and development are performed, to form the organic insulating film 317 such that the driver circuit portion, the first electrode layer 316 of the pixel portion, and the second interlayer insulating film 315 on the periphery of the pixel portion are exposed.

Next, a layer 318 which contains a light-emitting substance is formed by an evaporation method over a part of the first electrode layer 316 and the organic insulating film 317. The layer 318 which contains a light-emitting substance is formed of an organic or inorganic compound which has a light-emitting property. Note that alternatively, the layer 318 which contains a light-emitting substance may be formed of both an organic compound which has a light-emitting property and an inorganic compound which has a light-emitting property. Further, a red-light-emitting pixel, a blue-light-emitting pixel, and a green-light-emitting pixel can be formed by using a red-light-emitting substance, a blue-light-emitting substance, and a green-light-emitting substance, respectively, for the layer 318 containing a light-emitting substance.

Here, the layer containing a red-light-emitting substance is formed by stacking DNTPD which is 50 nm thick; NPB which is 10 nm thick; NPB to which bis[2,3-bis(4-fluorophenyl)quinoxalinato]iridium(acetylacetonate) (abbr.: Ir(Fdpq)$_2$(acac)) has been added, which is 30 nm thick; Alq$_3$ which is 60 nm thick; and LiF which is 1 nm thick. Further, the layer containing a green-light-emitting substance is formed by stacking DNTPD which is 50 nm thick; NPB which is 10 nm thick; Alq$_3$ to which coumarin 545T (C545T) has been added, which is 40 nm thick; Alq$_3$ which is 60 nm thick; and LiF which is 1 nm thick.

Further, the layer containing a blue-light-emitting substance is formed by stacking DNTPD which is 50 nm thick; NPB which is 10 nm thick; 9-[4-(N-carbazolyl)]phenyl-10-phenylanthracene (abbr.: CzPA) to which 2,5,8,11-tetra(tert-butyl)perylene (abbr.: TBP) has been added, which is 30 nm thick; Alq$_3$ which is 60 nm thick; and LiF which is 1 nm thick. Moreover, in addition to the red-light-emitting pixel, the blue-light-emitting pixel, and the green-light-emitting pixel, a white-light-emitting pixel may be formed, by forming the layer containing a light-emitting substance using a white light-emitting substance. Note that by providing a white-light-emitting pixel, power consumption can be reduced.

Next, a second electrode layer 319 is formed over the layer 318 which contains a light-emitting substance and the organic insulating film 317. Here, an Al film with a thickness of 200 nm is formed by an evaporation method. Accordingly, a light-emitting element 321 which includes the first electrode layer 316, the layer 318 which contains a light-emitting substance, and the second electrode layer 319 is formed.

In the case where a light-emitting layer formed of an organic compound is included in the layer 318 which contains a light-emitting substance, besides the light-emitting layer formed of an organic compound, a hole-injecting layer formed of a material with a hole-injecting property, a hole-transporting layer formed of a material with a hole-transporting property, an electron-transporting layer formed of a material with an electron-transporting property, and an electron-injecting layer formed of a material with an electron-injecting property can also be included in the layer 318 which contains a light-emitting substance, as appropriate.

Alternatively, as the layer 318 which contains a light-emitting substance, a light-emitting layer employing an inorganic compound can be formed. In that case, the light-emitting element 321 serves as an inorganic EL element. In that case, buffer layers may be provided between the light-emitting layer and the electrode layers 316 and 319. The buffer layers have a role of facilitating carrier injection, and suppressing mixing of the light-emitting layer and the electrode layer 316 and of the light-emitting layer and the electrode layer 319.

The inorganic EL element is classified as a dispersion-type inorganic EL element or a thin-film inorganic EL element, depending on its structure. Dispersion-type inorganic EL elements and thin-film inorganic EL elements differ from one another in that the former include a layer containing a light-emitting substance, in which particles of a light emitting material are dispersed in a binder, and the latter include a layer containing a light-emitting substance which is formed from a thin film of a light-emitting material. However, they share the fact that they require electrons accelerated by a high electric field. In the invention, there is no particular limitation on the structure of the inorganic EL element.

After forming the light-emitting element 321, a protective film 322 is formed over the second electrode layer 319, as shown in FIG. 7B. The protective film 322 is formed to prevent moisture, oxygen, and the like from penetrating the light-emitting element 321. The protective film 322 is preferably formed using silicon nitride, silicon oxide, silicon nitride oxide, silicon oxynitride, aluminum oxynitride, aluminum oxide, diamond-like carbon (DLC), carbon which contains nitrogen (CN), or another insulating material by a thin-film formation method such as a plasma CVD method, a sputtering method, or the like.

Further, when a sealing substrate 324 is attached to the second interlayer insulating film 315, which is formed over the substrate 100, by using a sealant 323, a structure results in which the light-emitting element 321 is provided in a space 325 which is enclosed by the substrate 100, the sealing substrate 324, and the sealant 323. The space 325 is filled with a filler, which may be an inert gas (e.g., nitrogen or argon). Alternatively, the space 325 can be filled with a resin material, such as the sealant 323 or the like.

Note that an epoxy-based resin is preferably used for the sealant 323. It is desirable that the material of the sealant 323 is a material which allows as little moisture and oxygen as possible to penetrate. Further, as the sealing substrate 324, a glass substrate, a quartz substrate, or a resin substrate can be used. For example, as a resin substrate, a substrate formed of FRP (fiberglass reinforced plastic), PVF (polyvinyl fluoride), PET (polyethylene terephthalate), PEN (polyethylene naphthalate), PES (polyethersulfone), a polyester-based resin, an acrylic-based resin, or the like can be used.

Subsequently, as shown in FIG. 7C, using an anisotropic conductive layer 326, an FPC 327 is attached to the conductive layer 320 which is in contact with the connecting terminal 314, similarly to in Embodiment Mode 2. Through the above process steps, an active matrix light-emitting device can be formed.

In the light-emitting device described in this embodiment mode, in the semiconductor layers (particularly in the channel forming regions) of the thin film transistors included in the driver circuit portion and the pixel portion, plane orientations of crystals are aligned in a specific direction. Therefore, variation in the electrical characteristics of the thin film transistors which drive the light-emitting elements can be suppressed; and as a result, a light-emitting device in which variation in luminance of light-emitting elements is reduced, which is capable of a high-resolution display with little color unevenness and faults can be manufactured.

Further, because the plane orientations of crystals are aligned in a specific direction, thin film transistors which have superior electrical characteristics, such as a low subthreshold swing, a high field-effect mobility, and the like can be formed. Therefore, a display device can have low power consumption and high resolution.

[Embodiment Mode 4]

In this embodiment mode, specific examples of electronic devices which have a semiconductor device of the invention will be described. In this embodiment mode, electronic devices which include display devices described in Embodiment Modes 2 and 3 in a display portion will be described. Examples of such electronic devices include television devices (also referred to simply as televisions, or television receivers), digital cameras, digital video cameras, portable telephone devices (also referred to simply as portable telephones, or mobile phones), portable information terminals such as PDAs and the like, portable game machines, monitors for computers, computers, sound reproducing devices such as car audio devices and the like, and image reproducing devices equipped with a recording medium, such as home-use game machines and the like, for example. Further examples are information display boards at railroad stations, airports, and the like; advertisement display boards in the street; and the like.

Below, specific examples of these electronic devices will be described with reference to FIGS. 8A to 8F. FIGS. 8A to 8F show external views of electronic devices.

A portable information terminal shown in FIG. 8A includes a main body 9201, a display portion 9202, and the like. By employing a display device described in Embodiment Mode 2 or 3 in the display portion 9202, a portable information terminal capable of high-resolution display can be provided at a low price.

A digital video camera shown in FIG. 8B includes a display portion 9701, a display portion 9702, and the like. By employing a display device described in Embodiment Mode 2 or 3 in the display portion 9701, a digital video camera capable of high-resolution display can be provided at a low price.

A portable telephone shown in FIG. 8C includes a main body 9101, a display portion 9102, and the like. By employing a display device described in Embodiment Mode 2 or 3 in the display portion 9102, a highly reliable portable telephone can be provided at a low price.

A portable television device shown in FIG. 8D includes a main body 9301, a display portion 9302, and the like. By employing a display device described in Embodiment Mode 2 or 3 in the display portion 9302, a portable television device capable of high-resolution display can be provided at a low price.

A portable computer shown in FIG. 8E includes a main body 9401, a display portion 9402, and the like. By employing a display device described in Embodiment Mode 2 or 3 in the display portion 9402, a portable computer capable of display with high image quality can be provided at a low price.

A television device shown in FIG. 8F includes a main body 9501, a display portion 9502, and the like. By employing a display device described in Embodiment Mode 2 or 3 in the display portion 9502, a television device capable of high-resolution display can be provided at a low price.

Figure 9:
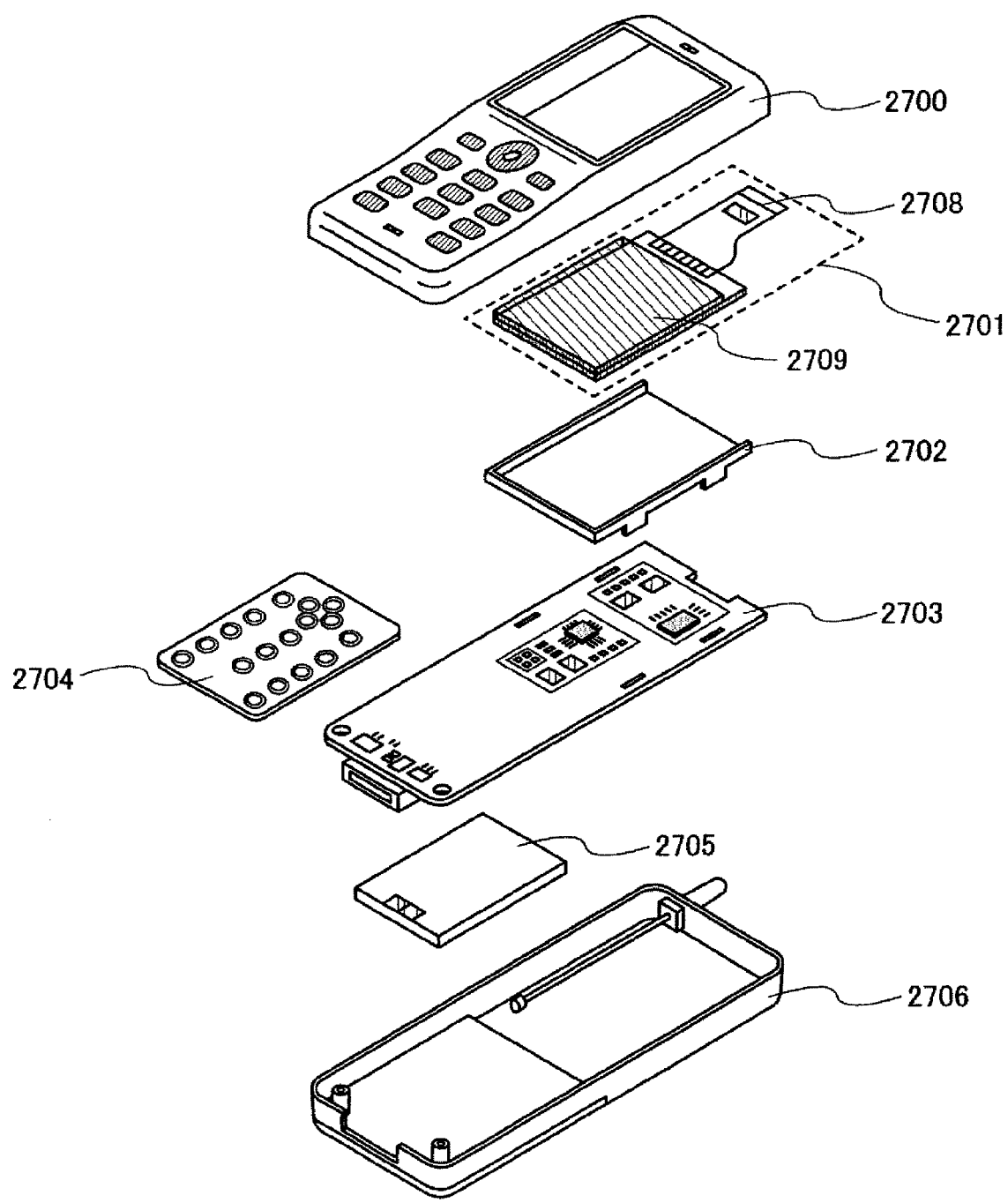
FIG. 9 is an exploded view of the portable telephone in FIG. 8C.

A more specific structure of the portable telephone in FIG. 8C will now be described with reference to FIG. 9. FIG. 9 is an exploded view of the portable telephone.

As shown in FIG. 9, the portable telephone includes cases 2700 and 2706, a panel 2701, a housing 2702, a printed wiring board 2703, operation buttons 2704, and a battery 2705. The panel 2701 is detachably incorporated into the housing 2702, and the housing 2702 is fitted to the printed wiring board 2703. The shape and dimensions of the housing 2702 are changed as appropriate to suit an electronic appliance into which the panel 2701 is incorporated.

A plurality of semiconductor devices that are packaged are mounted on the printed wiring board 2703. A semiconductor device of the invention can be used as one of these semiconductor devices. The plurality of semiconductor devices mounted on the printed wiring board 2703 have any of the following functions: the function of a controller, the function of a central processing unit (CPU), the function of a memory, the function of a power supply circuit, the function of an audio processing circuit, the function of a sending/receiving circuit, and the like.

The panel 2701 is connected to the printed wiring board 2703 via a connection film 2708. The panel 2701, the housing 2702, and the printed wiring board 2703 are housed in the cases 2700 and 2706, together with the operation buttons 2704 and the battery 2705. A pixel region 2709 in the panel 2701 is disposed such that it can be observed through a window opening provided in the case 2700. A display device described in Embodiment Mode 2 or 3 can be used for the panel 2701.

Figure 10:
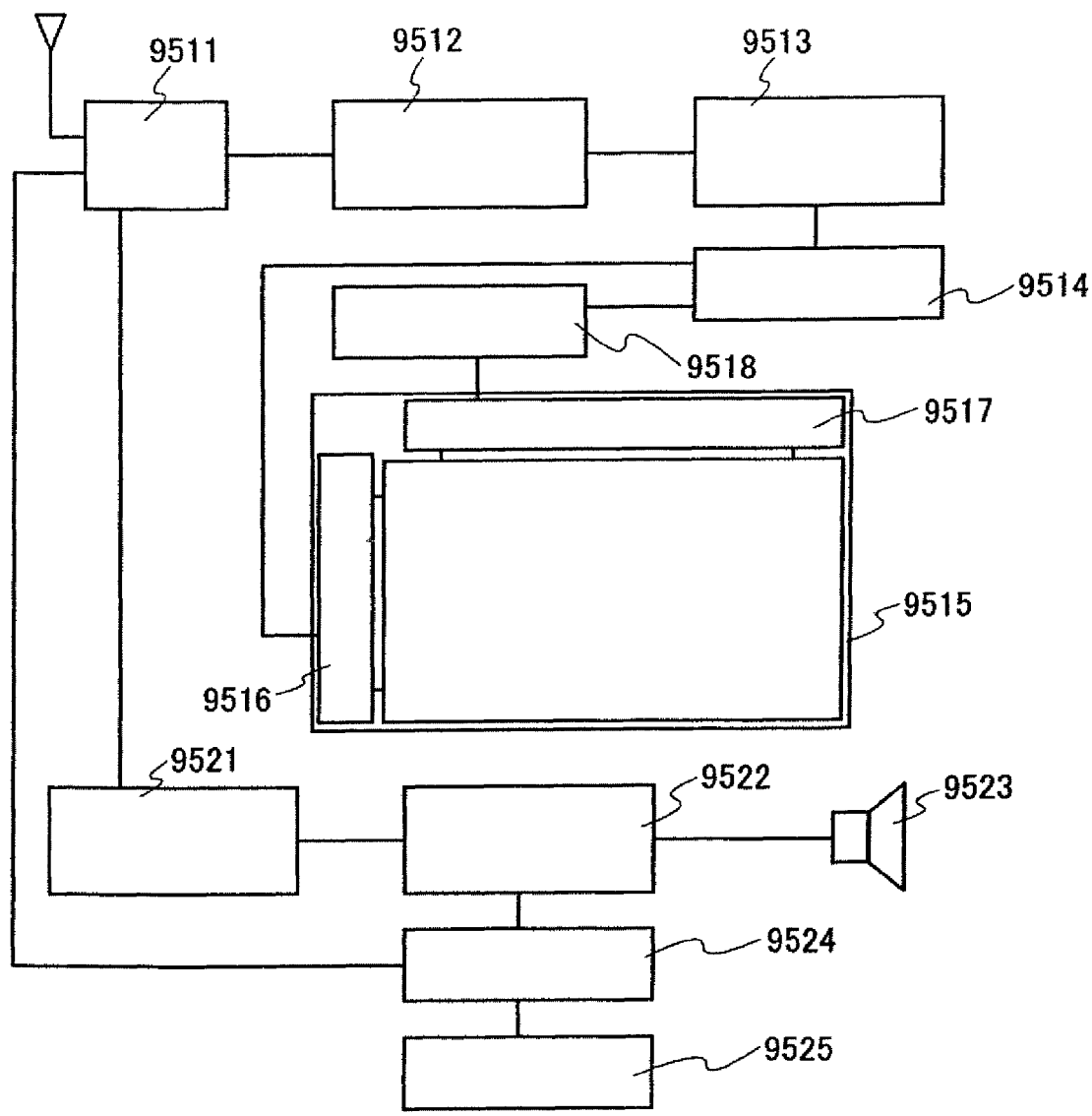
FIG. 10 is a block diagram which shows a structural example of the television devices in FIGS. 8D and 8F.

Next, a structural example of the television devices shown in FIGS. 8D and 8F will be described with reference to FIG. 10. FIG. 10 is a block diagram which shows a main structure of a television device.

A tuner 9511 receives an image signal and an audio signal. The image signal is processed through an image detection circuit 9512; an image signal processing circuit 9513 which converts a signal outputted from the image detection circuit 9512 into a color signal which corresponds to red, green, or blue; and a control circuit 9514 for converting the image signal in accordance with input specifications of a driver IC.

The control circuit 9514 outputs signals to a scanning line driver circuit 9516 and a signal line driver circuit 9517 of a display panel 9515. Note that in a case where digital driving is used, a structure can be employed in which a signal dividing circuit 9518 is provided on a side of output of the control circuit 9514 to the signal line driver circuit 9517, so that an inputted digital signal is divided into m number of signals which are supplied.

The audio signal received by the tuner 9511 is sent to an audio detection circuit 9521 and output of the audio detection circuit 9521 is supplied to a speaker 9523 via an audio signal processing circuit 9522. The control circuit 9524 receives control information such as a receiving station (a receiving frequency) and sound volume from an input portion 9525, and outputs signals to the tuner 9511 and the audio signal processing circuit 9522.

[Embodiment Mode 5]

In this embodiment mode, a semiconductor device which is capable of transmitting data contactlessly will be described.

Figure 11:
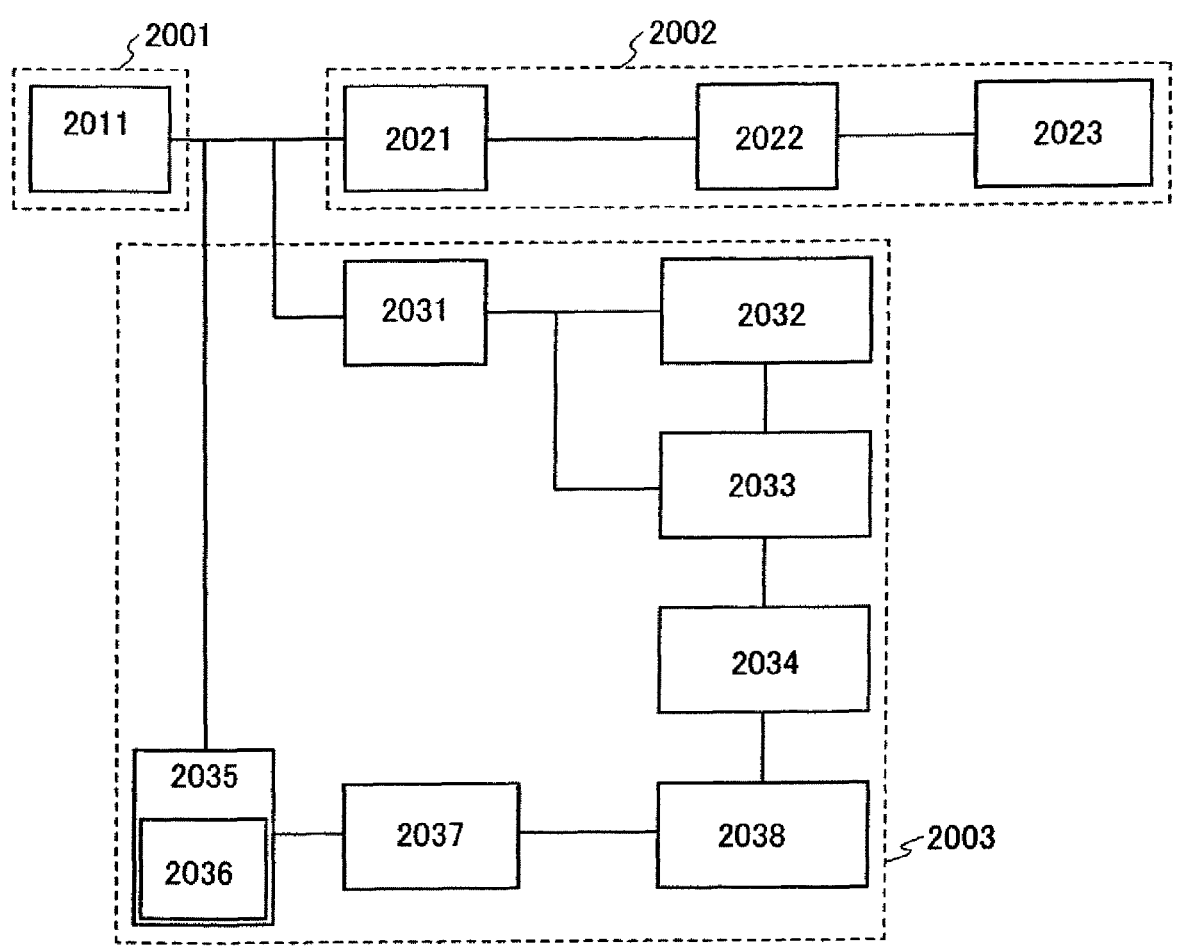
FIG. 11 is a block diagram of a semiconductor device of the invention which can transmit data contactlessly.

First, a structure of a semiconductor device which is capable of transmitting data contactlessly will be described with reference to FIG. 11. FIG. 11 is a block diagram which shows a structural example of a semiconductor device which is capable of transmitting data contactlessly. A semiconductor device of this embodiment mode includes an antenna portion 2001, a power supply portion 2002, and a logic portion 2003 as its main components.

The antenna portion 2001 includes an antenna 2011 which receives external signals and transmits data. A method of transmitting a signal employed by the semiconductor device can be an electromagnetic coupling method, an electromagnetic induction method, a microwave method, or the like. Note that a practitioner of the invention selects the transmission method as appropriate taking an intended use of the device into account, and the antenna 2011 which is most suitable for the transmission method is provided.

The power supply portion 2002 includes a rectifier circuit 2021, a storage capacitor 2022, and a constant voltage circuit 2023. The rectifier circuit 2021 produces voltage from a radio wave received by the antenna portion 2001. The storage capacitor 2022 stores the voltage generated by the rectifier circuit 2021. The constant voltage circuit 2023 is a circuit for making the voltage generated by the rectifier circuit 2021 a certain level.

The logic portion 2003 includes a demodulation circuit 2031 which demodulates a received signal; a clock generating/compensating circuit 2032 which generates a clock signal; a code recognition and determination circuit 2033; a memory controller 2034 which produces a signal for reading data from a memory based on a received signal; a modulation circuit 2035 for superposing an encoded signal on a received signal; an encoder circuit 2037 which encodes read data; and a mask ROM 2038 which stores data. The modulation circuit 2035 includes a resistor 2036 for modulating.

A code recognized and determined by the code recognition and determination circuit 2033 is a frame termination signal (EOF: end of frame); a frame starting signal (SOF: start of frame); a flag; a command code; a mask length; a mask value; or the like. The code recognition and determination circuit 2033 also includes a cyclic redundancy check (CRC) function for identifying transmission errors.

A method of manufacturing a semiconductor device which includes the antenna portion 2001, the power supply portion 2002, and the logic portion 2003 will now be described with reference to FIGS. 12A to 15D. FIGS. 12A to 15D are cross-sectional views of a method of manufacturing a semiconductor device of this embodiment mode. Note that in FIGS. 12A to 15D, thin film transistors are shown as typical examples of portions included in the power supply portion 2002 and the logic portion 2003. In the power supply portion 2002 and the logic portion 2003, besides thin film transistors, various semiconductor elements, such as diodes, resistors, capacitors, memory elements, or the like, are formed to suit the functions of each circuit.

Further, in this embodiment mode, as a method of manufacturing a semiconductor device, a technique is described in which semiconductor elements are manufactured over a substrate, and then the substrate used for manufacturing is separated from the semiconductor elements, and the semiconductor elements are transposed to another substrate. By employing this technique, not just the semiconductor device of this embodiment mode, but also other semiconductor devices, such as the display devices described in Embodiment Modes 2 and 3, or the like, can be manufactured.

Figure 12A:
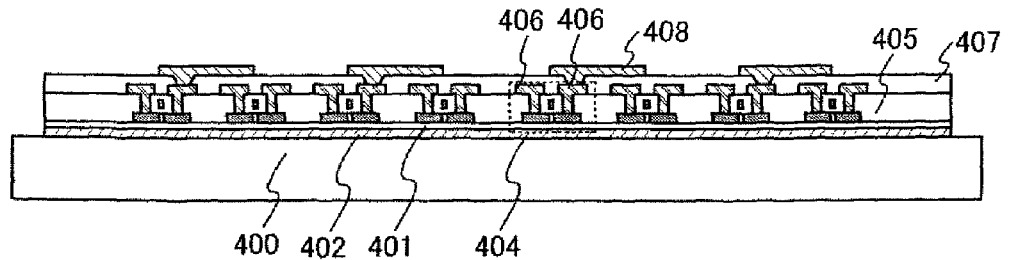
FIGS. 12A to 12E are cross-sectional views showing a method of manufacturing a semiconductor device of the invention. They show a method of manufacturing a semiconductor device which can transmit data contactlessly.

First, as shown in FIG. 12A, a substrate 400 is prepared. As the substrate 400, a metal substrate or a stainless steel substrate with a surface over which an insulating film is formed; a plastic substrate having heat resistance which can withstand processing temperatures of this process; or the like can be used. However, here, a glass substrate is used as the substrate 400

Next, before forming an insulating film 401 which serves as a base, a separation film 402 is formed over the substrate 400. The substrate 400 is separated from the semiconductor elements by causing separation in the separation film 402.

The separation film 402 is a single layer film or a stacked layer film which includes any one of the elements tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si), or an alloy material or a compound material containing an above-mentioned element as a main component. Note that a crystal structure of a layer which includes silicon may be any one of amorphous, microcrystalline, or polycrystalline. A film which includes an above-mentioned material can be formed by a sputtering method, a plasma CVD method, an application method, a printing method, or the like.

When the separation film 402 is formed with a single-layer structure, preferably a tungsten layer, a molybdenum layer, or a layer including a mixture of tungsten and molybdenum is formed. Note that a mixture of tungsten and molybdenum corresponds to an alloy of tungsten and molybdenum, for example. Alternatively, when the separation film 402 is formed as a single layer which includes a compound material, preferably tungsten oxide, tungsten oxynitride, molybdenum oxide, molybdenum oxynitride, a mixture of tungsten oxide and molybdenum oxide, or a mixture of tungsten oxynitride and molybdenum oxynitride is used.

When the separation film 402 is formed with a stacked-layer structure, preferably, as a first layer, any one of a tungsten layer, a molybdenum layer, and a layer including a mixture of tungsten and molybdenum is formed; and as a second layer, any one of a tungsten layer, a molybdenum layer, a tungsten or molybdenum oxide layer, a tungsten or molybdenum nitride layer, a tungsten or molybdenum oxynitride layer, and a layer including a mixture of tungsten oxide and molybdenum oxide is formed.

To form a stacked layer film which includes a tungsten layer and a tungsten oxide layer as the separation film 402, a method can be employed in which a tungsten layer is formed and an insulating film formed of an oxide (typically, a silicon oxide film) is formed over the tungsten layer, and thereby a layer which includes tungsten oxide is formed at an interface of the tungsten layer and the insulating film. When this method is employed to form a nitride or an oxynitride as the second layer, a layer which includes tungsten is formed, and then a silicon nitride layer, a silicon oxynitride layer, or a silicon nitride oxide layer is formed over the layer which includes tungsten.

Alternatively, a tungsten oxide layer can be formed on a surface of the tungsten layer by subjecting the surface of the tungsten layer to thermal oxidation treatment; oxygen plasma treatment; $N_2O$ plasma treatment; a treatment which uses a solution which has strong oxidizability, such as ozone water or the like; a treatment which uses water to which hydrogen has been added; or the like.

The above-described formation method can also be used in the case of forming a stacked-layer film which includes a molybdenum layer and a layer which includes a molybdenum compound, such as an oxide or the like, as the separation film 402.

Note that tungsten oxide is denoted as $WO_x$. In this embodiment mode, x is in the range of $2 \leq x \leq 3$. When x is 2, tungsten oxide is denoted as $WO_2$, and there are cases where x is 2.5 ($W_2O_5$), x is 2.75 ($W_4O_{11}$), x is 3 ($WO_3$), and the like.

As a method of forming the separation film 402 and the insulating film 401 of this embodiment mode, here, a tungsten film is formed to a thickness of 20 to 100 nm, preferably 40 to 80 nm, by a sputtering method. Subsequently, while flowing an $N_2O$ gas, plasma is generated, and a surface of the separation film 402 is oxidized to form a tungsten oxide film. After that, a stacked layer film which includes a silicon nitride oxide film and a silicon oxynitride film is formed by a plasma CVD method. The stacked layer film is the base insulating film 401.

Next, the insulating film 401 is formed over the separation film 402 in a similar manner to that in Embodiment Modes 1 and 2, and thin film transistors 404 are formed over the insulating film 401. For the thin film transistors 404, the thin film transistor manufacturing method described in Embodiment Mode 2 can be used. The thin film transistors 404 can be formed in a similar manner to the thin film transistors 225 to 227 of Embodiment Mode 2.

Next, an interlayer insulating film 405 which covers the thin film transistors 404 is formed, and wirings 406 which are electrically connected to the thin film transistors 404 are formed over the interlayer insulating film 405. The wirings 406 can be formed in a similar manner to the wirings 234 to 239 described in Embodiment Mode 2, for example. Next, an insulating film 407 which covers the wirings 406 is formed, and a conductive film 408 which connects to the wirings 406 is formed over the insulating film 407.

The interlayer insulating film 405 and the insulating film 407 can be formed using a resin material. For example, they can be formed be applying and baking a polyimide, an acrylic, or a siloxane polymer. Alternatively, they may formed using an inorganic compound by a sputtering method, a plasma CVD method, an application method, a printing method, or the like, as a single layer or a stacked layer. Typical examples of inorganic compounds which may be used are silicon oxide, silicon nitride, silicon oxynitride, and silicon nitride oxide.

Figure 12B:
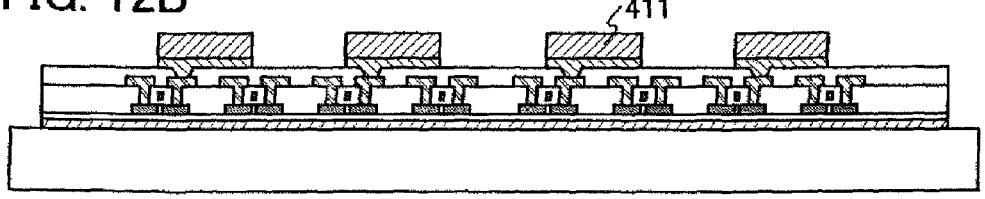

Next, as shown in FIG. 12B, a conductive film 411 is stacked over the conductive film 408. Here, the conductive film 411 is formed by printing a composition including gold particles by a printing method and performing heating at 200° C. for 30 minutes to bake the composition. Alternatively, the conductive film 411 can be formed by forming a conductive film using an evaporation method or a sputtering method and processing the conductive film into a desired shape using etching.

Figure 12C:
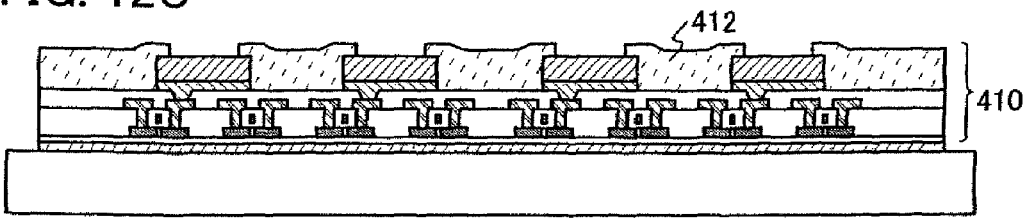

Next, as shown in FIG. 12C, an insulating film 412 with a thickness of 1 to 20 μm, preferably 5 to 10 μm, is formed over the insulating film 407. Here, the insulating film 412 is formed using an epoxy resin. The epoxy resin is hardened by applying a solution containing a composition of the epoxy resin using a spin coat method and performing heating at 160° C. for 30 minutes to harden the solution. Subsequently, a part of the epoxy resin which covers the conductive film 411 is removed to expose an upper surface of the conductive film 411; however, the conductive film 408 and the periphery of the conductive film 411 are covered by the epoxy resin.

Here, a layer stack which includes from the insulating film 401 to the insulating film 412 is referred to as an element formation layer 410.

Figure 12D:
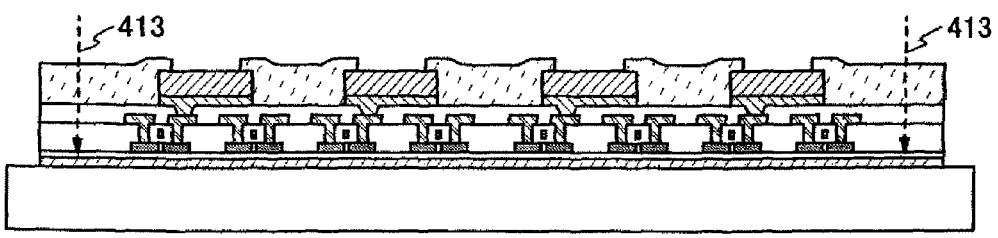
Figure 12E:
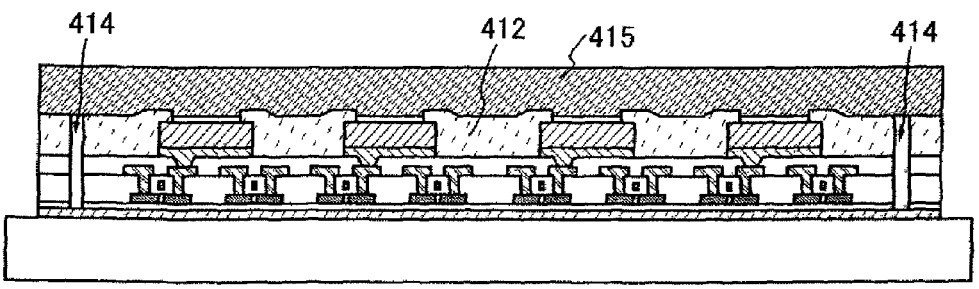

Next, as shown in FIG. 12D, in order to facilitate a subsequent separation process, the insulating films 401, 405, and 407, and the insulating film 412 are irradiated with a laser beam 413, and an opening portion 414 such as that shown in FIG. 12E is formed. When irradiation with the laser beam 413 is performed, the insulating films 401, 405, 407, and 412 absorb the laser beam 413 and melt, and thus the opening portion 414 is formed. The opening portion 414 is formed such that it surrounds the periphery of the substrate 400. After the opening portion 414 has been formed, an adhesive member 415 is attached to the insulating film 412. Note that in the case where the element formation layer 410 can be easily separated from the substrate 400 without forming the opening portion 414, irradiation with the laser beam 413 can be omitted from the process.

Figure 13A:
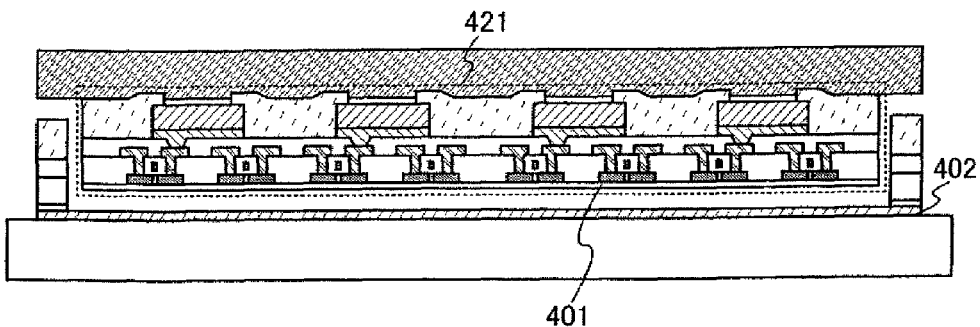
FIGS. 13A to 13D are cross-sectional views showing process steps which follow on from those of FIG. 12E.

Next, a separation is caused in a metal oxide layer (here, the tungsten oxide layer) formed at the interface between the separation film 402 and the insulating film 401, and the element formation layer 410 is separated from the substrate 400, as shown in FIG. 13A. In this process, the adhesive member 415 serves as a support member for supporting the element formation layer 410 which has been separated from the substrate 400.

Because the tungsten oxide layer formed over the separation film 402 is fragile, the element formation layer 410 can be separated from the substrate 400 by applying mechanical force to cause separation. Typical methods of separating the element formation layer 410 from the substrate 400 include a method in which the element formation layer 410 is peeled by a human hand and a gripper and a method in which a separation device which includes a roller is used.

Note that although a method in which the separation film 402 is formed is used to separate the element formation layer 410 from the substrate 400 in this embodiment mode, a method in which the separation film 402 is not formed can also be used. For example, subsequent to the process step shown in FIG. 12E, a method in which the substrate 400 is removed by mechanically grinding and polishing or a method in which a solution such as HF or the like is used to dissolve the substrate 400 can be used.

Figure 13B:
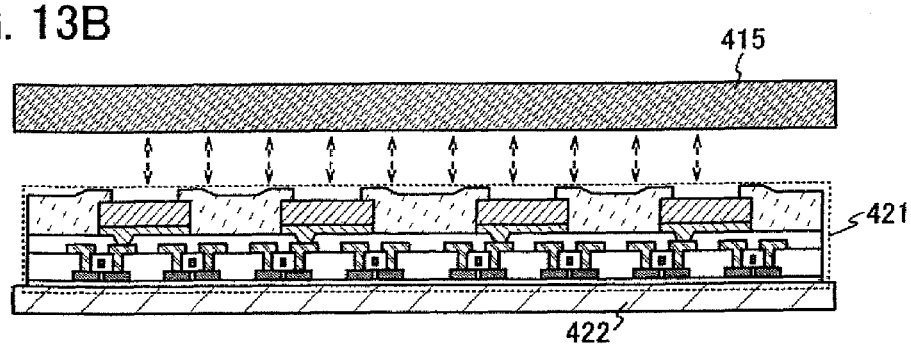

Next, as shown in FIG. 13B, a flexible substrate 422 is attached to the insulating film 401 included in the element formation layer 410, and subsequently, the adhesive member 415 is peeled from the element formation layer 410. Here, as the flexible substrate 422, a film formed by a casting method using polyaniline is used.

Figure 13C:
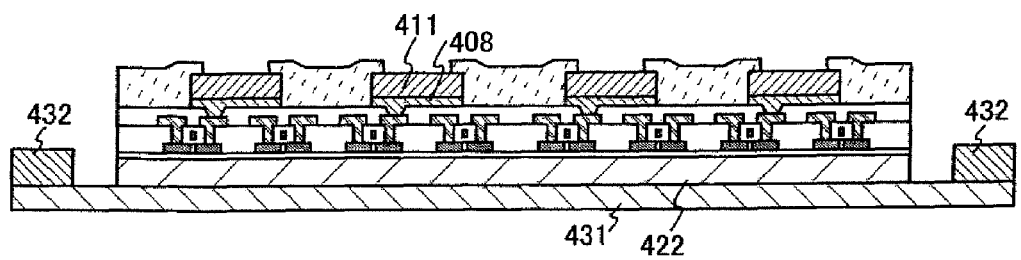

Subsequently, as shown in FIG. 13C, the flexible substrate 422 is attached to a UV sheet 431 of a dicing frame 432. Because the UV sheet 431 is adhesive, the flexible substrate 422 is firmly fixed over the UV sheet 431. Subsequently, the conductive film 411 may be irradiated with a laser beam to increase adhesion between the conductive film 411 and the conductive film 408.

Figure 13D:
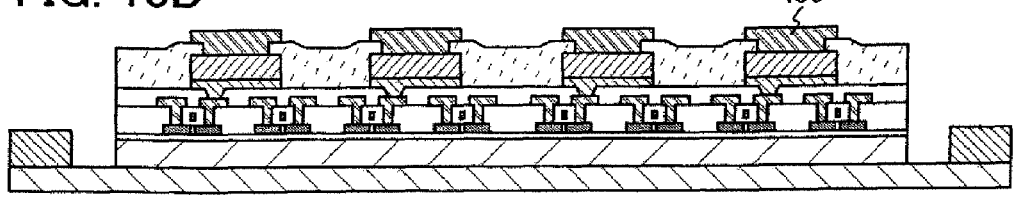

Next, as shown in FIG. 13D, a connecting terminal 433 is formed over the conductive film 411. When the connecting terminal 433 is formed, alignment with a conductive film which subsequently serves as an antenna and electrical connection with the element formation layer 410 can be easily performed.

Figure 14A:
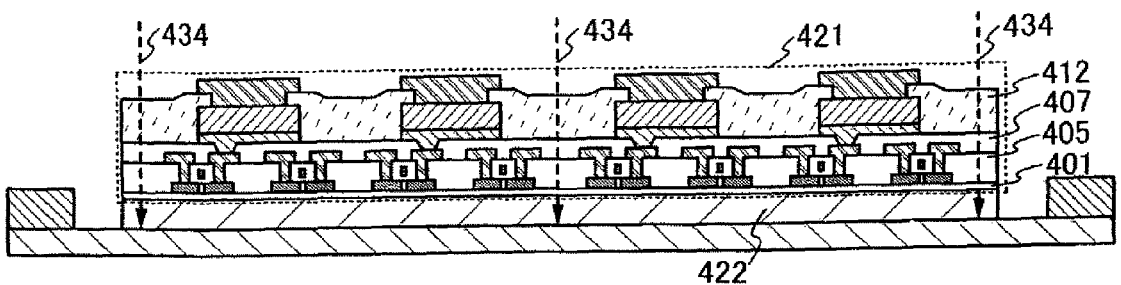
FIGS. 14A to 14C are cross-sectional views showing process steps which follow on from those of FIG. 13D.
Figure 14B:
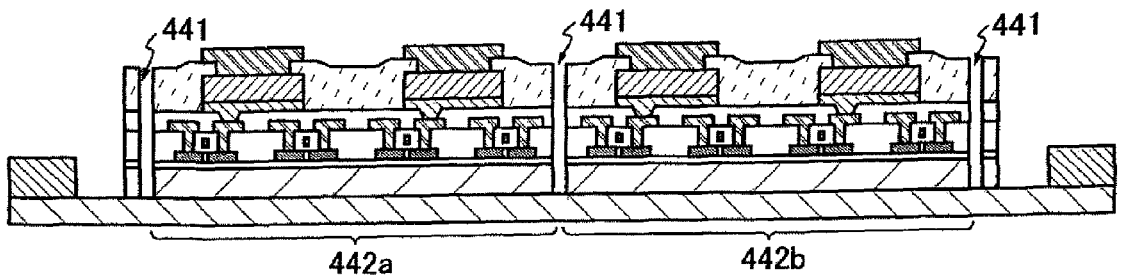

Next, as shown in FIG. 14A, the element formation layer 410 and the flexible substrate 422 are irradiated with a laser beam 434; and, as shown in FIG. 14B, the element formation layer 410 is divided into a plurality of parts. This is a process for dividing the element formation layer 410 into separate devices, because over the one substrate 400, a plurality of circuits included in semiconductor devices are formed. Note that in this embodiment mode, a laser cutting method is used for dividing the element formation layer 410; however, a dicing method, a scribing method, or the like can be used. Further, here, the element formation layer 410 which has been divided into separate devices is referred to as thin film integrated circuits. Note that although FIG. 14B shows an example in which the element formation layer 410 is divided into two thin film integrated circuits; that is, a thin film integrated circuit 442a and a thin film integrated circuit 442b; the number of thin film integrated circuits is not limited to two.

Figure 14C:
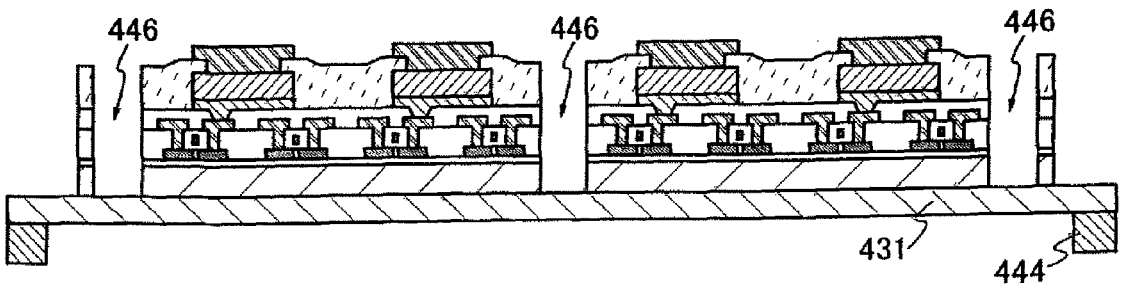

Subsequently, the UV sheet 431 of the dicing frame 432 is irradiated with UV light to decrease the adhesion of the UV sheet 431; and then, the UV sheet 431 is supported by an expander frame 444. At that time, the UV sheet 431 is supported by the expander frame 444 with the UV sheet being in a stretched-out state. As a result, as shown in FIG. 14C, the width of a groove 441 formed between the thin film integrated circuits 442a and 442b can be expanded. Note that preferably, an expanded groove 446 is adjusted to suit the size of an antenna substrate which is subsequently attached to the thin film integrated circuits 442a and 442b.

Next, an antenna substrate 457 is prepared. The antenna substrate 457 includes the flexible substrate 456; conductive films 452a and 452b which serve as antennas, which are formed over the flexible substrate 456; and an insulating film 453 which seals the conductive films 452a and 452b. Note that over the flexible substrate i5 456, the conductive films which serve as antennas are formed to correspond with the thin film integrated circuits, and opening portions are provided such that portions of the conductive films which serve as antennas are exposed.

Figure 15A:
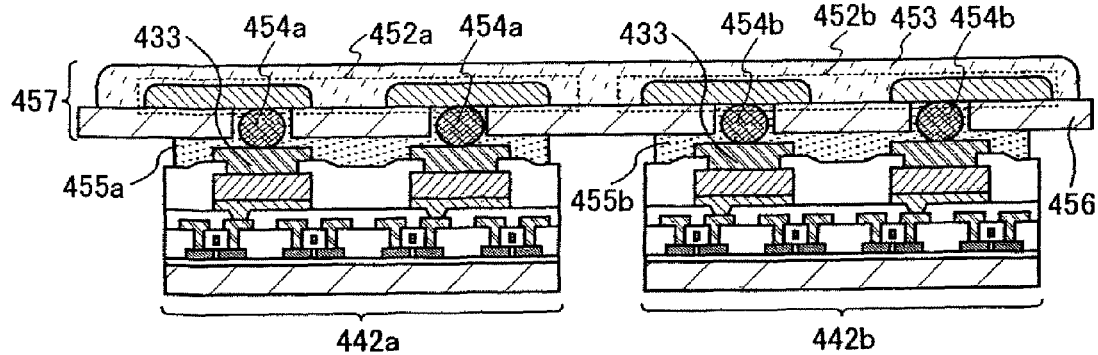
FIGS. 15A to 15D are cross-sectional views showing process steps which follow on from those of FIG. 14C.

Then, using anisotropic conductive adhesives 455a and 455b, the antenna substrate 457 is attached to the thin film integrated circuits 442a and 442b. As a result, as shown in FIG. 15A, the conductive film 452a is electrically connected to the connecting terminals 433 of the thin film integrated circuit 442a by conductive particles 454a included in the anisotropic conductive adhesive 455a, and the conductive film 452b is electrically connected to the connecting terminals 433 of the thin film integrated circuit 442b by conductive particles 454b included in the anisotropic conductive adhesive 455b.

Figure 15B:
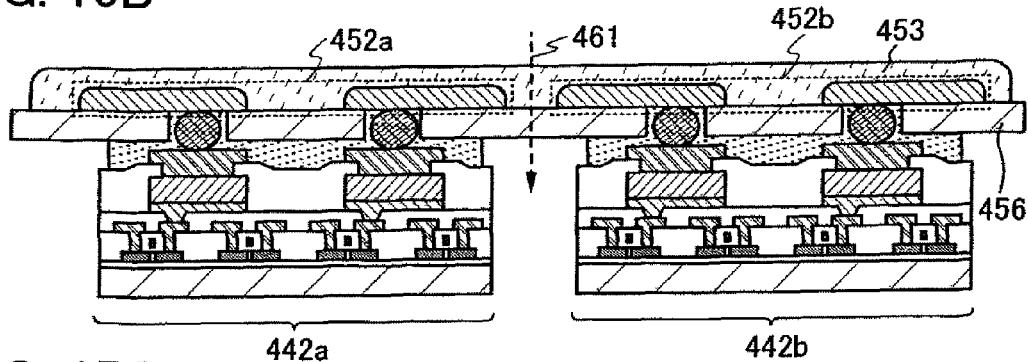
Figure 15C:
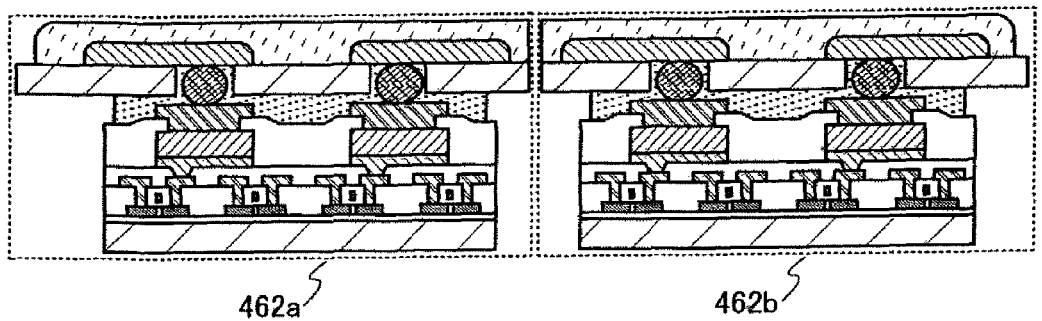
Figure 15D:
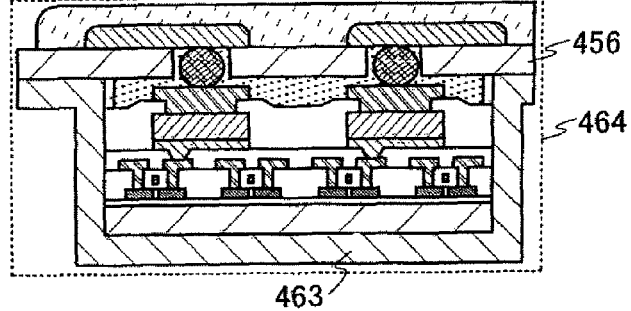

Next, as shown in FIG. 15B, the antenna substrate 457 is divided at a region where the conductive films 452a and 452b and the thin film integrated circuits 442a and 442b are not formed. Here, division is performed by a laser cutting method which uses a laser beam 461. Through the above process, as shown in FIG. 15C, semiconductor devices 462a and 462b which can transmit data contactlessly can be manufactured.

Note that division of the element formation layer 410 and the antenna substrate 457 may also be performed in the following manner. The antenna substrate 457 is attached to the thin film integrated circuits 442a and 442b using the anisotropic conductive adhesives 455a and 455b (FIG. 15A), and a flexible substrate 463 is provided so as to seal the thin film integrated circuits 442a and 442b. Next, by using a laser cutting method to divide the antenna substrate 457, a semiconductor device 464, such as that shown in FIG. 15D, in which the thin film integrated circuits are sealed using the flexible substrate 463 can be manufactured. In the semiconductor device 464 shown in FIG. 15D, because the thin film integrated circuits are sealed by the flexible substrate 463 and the flexible substrate 456 of the antenna substrate 457, degradation of the thin film integrated circuits can be suppressed more than it can in the semiconductor devices 462a and 462b shown in FIG. 15C.

Through the above-described process, a semiconductor device that is thin, light, and can bend can be manufactured. Further, because plane orientations of crystals in the semiconductor layers of the thin film transistors (in particular, the channel forming regions) of the semiconductor device are aligned, variation in electrical characteristics of the thin film transistors can be suppressed. Therefore, a high-performance, highly reliable semiconductor device can be manufactured.

Applications of the semiconductor device which can transmit data contactlessly will now be described with reference to FIGS. 16A to 16F.

A semiconductor device 500 of this embodiment mode is used after being fixed to a surface of an article, embedded in an article, or the like. For example, in the case of an article in which paper is used, such as a book or the like, the semiconductor device 500 is embedded in the paper after or during the manufacture of the paper. In the case of a package made from an organic resin, the semiconductor device 500 is embedded in the organic resin or mounted to a printed wiring board of an electronic device or the like.

Figure 16A:
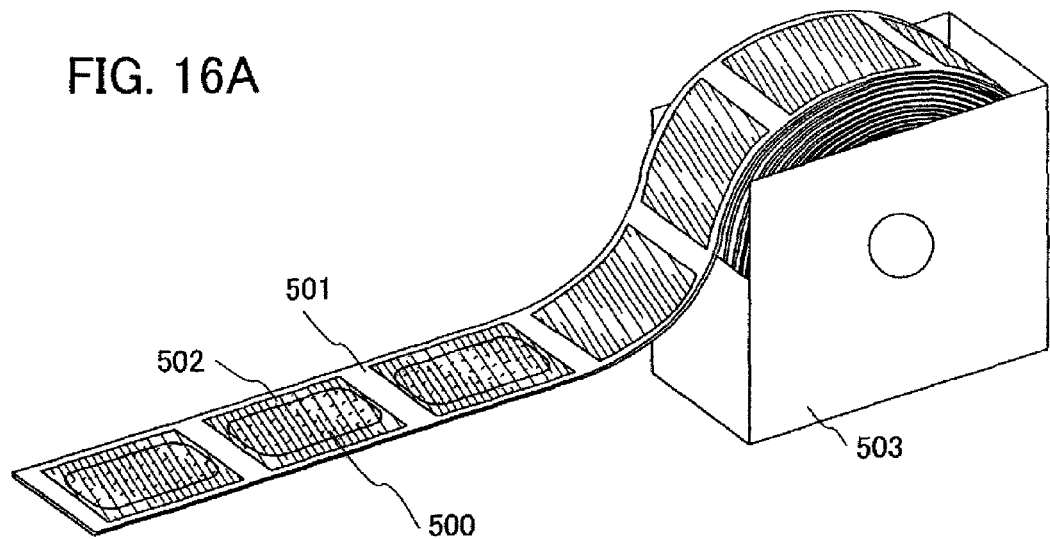
FIGS. 16A to 16F show applications of a semiconductor device of the invention which can transmit data contactlessly.

FIG. 16A shows a structural example of ID labels employing semiconductor devices 500 of this embodiment mode. A plurality of ID labels 502 are formed over a label board 501 (separate paper). Each of the ID labels 502 includes the semiconductor device 500 which has an antenna which is capable of wireless communication and a thin film integrated circuit. The ID labels 502 are stored in a box 503. On the ID label 502, there is information about a product or service (e.g., a name of a product, a brand, a trademark, a trademark owner, a seller, or a manufacturer), while ID numbers that are unique to the product (or the type of the product) are stored in the thin film integrated circuits of the included semiconductor devices 500. A large amount of information that cannot be clearly put on a surface of the ID label 502 (for example, a production area, selling area, quality, raw material, efficacy, use, quantity, form, price, production method, usage, time of production, period of use, expiration date, instructions, information about the intellectual property of the product, or the like) is stored in the integrated circuit of the semiconductor device 500.

Figure 16B:
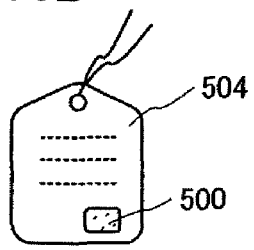

FIG. 16B shows a structural example of an ID tag 504. In the ID tag 504, the semiconductor device 500 is included in a paper or plastic tag. By providing a product with the ID tag 504 which is capable of wireless communication, management of the product is simplified, because a distribution channel of the product can be traced.

Figure 16C:
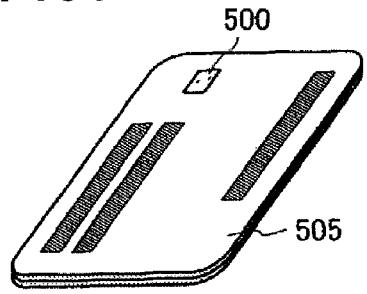

FIG. 16C shows a structural example of an ID card 505. In the ID card 505, the semiconductor device 500 is interposed between two plastic cards. The ID card 505 may be any kind of card, including a cash card, a credit card, a prepaid card, an electronic ticket, electronic money, a telephone card, a membership card, and the like.

Figure 16D:
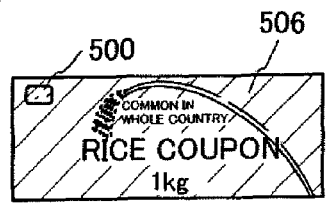
Figure 16F:
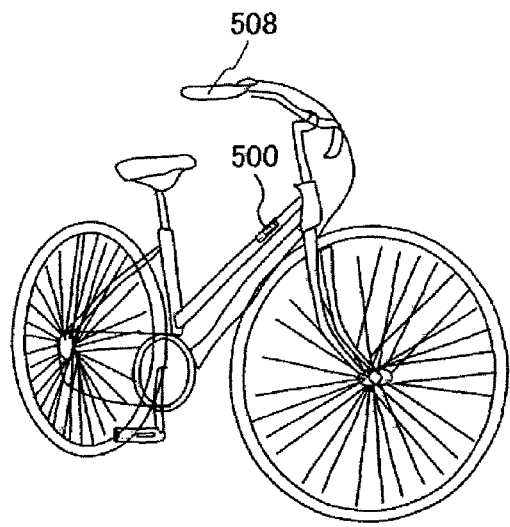
Figure 16E:
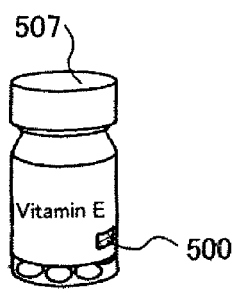

FIG. 16D shows a structural example of an article in which the semiconductor device 500 is included in paper; specifically, a bearer bond 506. The semiconductor device 500 is embedded in the bearer bond 506. The bearer bond 506 may be a stamp; a ticket, such as an admission ticket or the like; or a coupon, such as a merchandise coupon, a book coupon, a stationery coupon, a beer coupon, a rice coupon, various types of gift coupon, various types of service coupon, or the like.

Further, instead of providing an article with the ID tag 504 shown in FIG. 16B, an article can be provided with the semiconductor device 500. By providing wrapping materials or packing materials, such as wrapping paper, a container, a bottle, or the like (e.g., a bottle 507 in FIG. 16E); means of transportation, such as a bicycle, a motorcycle, or the like (e.g., a bicycle 508 in FIG. 16F); personal belongings; food; clothing; everyday articles; electronic appliances; or the like with the semiconductor device 500 of this embodiment mode, the efficiency of a system such as an inspection system or the like can be improved.

[Embodiment 1]

In this embodiment, an aspheric cylindrical lens for obtaining a linear laser beam with a width of less than or equal to 2 μm will be described.

In order to design an aspheric cylindrical lens, a rotationally symmetrical aspheric lens capable of condensing a beam spot into a circular shape with a diameter of 2 μm was designed. ZEMAX (manufactured by ZEMAX Development Corporation Inc.), which is a general purpose optical design software, was used for the optical design of the rotationally symmetrical aspheric lens. For the lens surface type, an even-ordered aspheric surface (an even surface) prepared using ZEMAX was used. The even-ordered aspheric surface was described by an even-ordered polynomial with radial coordinates r, using an aspherical surface described using a conic constant as a base. A sag d of this surface is described by Equation 1 below.

[Equation 1]

$$d = \frac{cr^2}{1 + \sqrt{1 - (1+k)c^2 r^2}} + \alpha_1 r^2 + \alpha_2 r^4 + \alpha_3 r^6 + \alpha_4 r^8 + \alpha_5 r^{10} + \alpha_6 r^{12} + \alpha_7 r^{14} + \alpha_8 r^{16} \quad (1)$$

Note that in Equation 1, c is the reciprocal of the radius of curvature, k is the conic constant, r is the radius of the spherical surface, and $\alpha_1$, $\alpha_2$, $\alpha_3$, ... $\alpha_8$ are aspheric surface coefficients.

In this embodiment, in Equation 1, the value of each of the aspheric surface coefficients which have r with a degree of six or more, that is, the value of each of the aspheric surface coefficients $\alpha_3$, $\alpha_4$, $\alpha_5$, ... $\alpha_8$, was zero, and only the first to the third terms of the polynomial were used.

Figure 18:
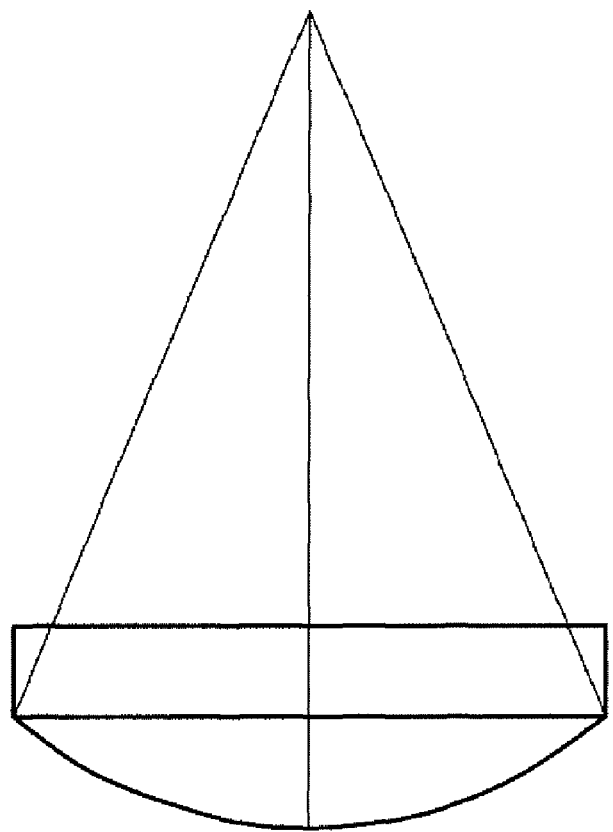
FIG. 18 shows a software window of software used for designing a rotationally symmetrical aspheric lens. The software window shows a cross-section of the rotationally symmetrical aspheric lens.

FIGS. 17 to 21 show ZEMAX windows from when the rotationally symmetrical aspheric lens was designed. FIG. 17 shows a parameter input window for Equation 1, which shows lens data for the rotationally symmetrical aspheric lens. FIG. 18 is a window showing a cross section of a surface which includes a rotational central axis of the rotationally symmetrical aspheric lens. As shown by FIG. 18, the designed rotationally symmetrical aspheric lens is a plano-convex lens.

Figure 19:
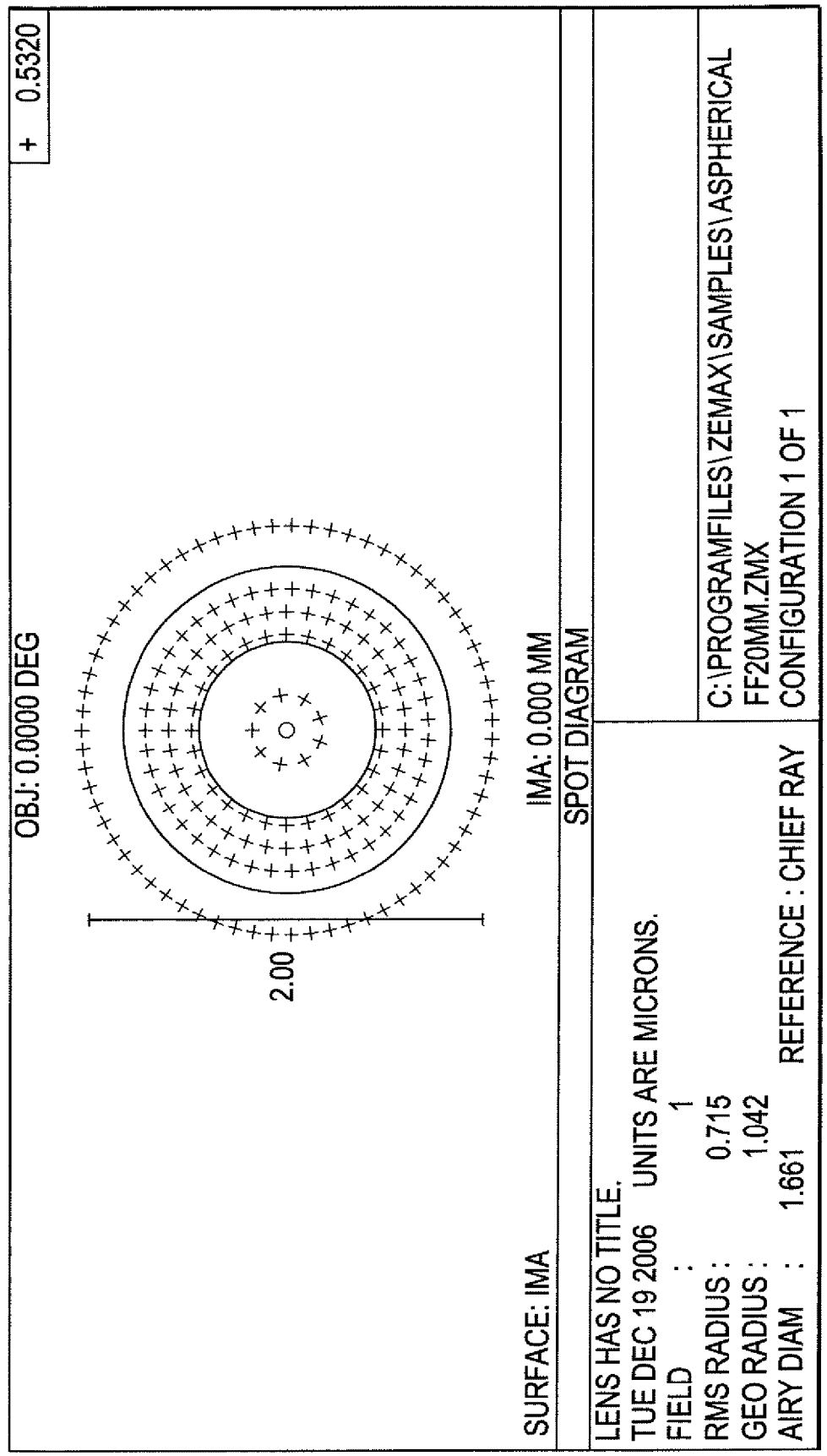
FIG. 19 shows a software window of software used for designing a rotationally symmetrical aspheric lens. The software window shows a spot diagram of the rotationally symmetrical aspheric lens.
Figure 20:
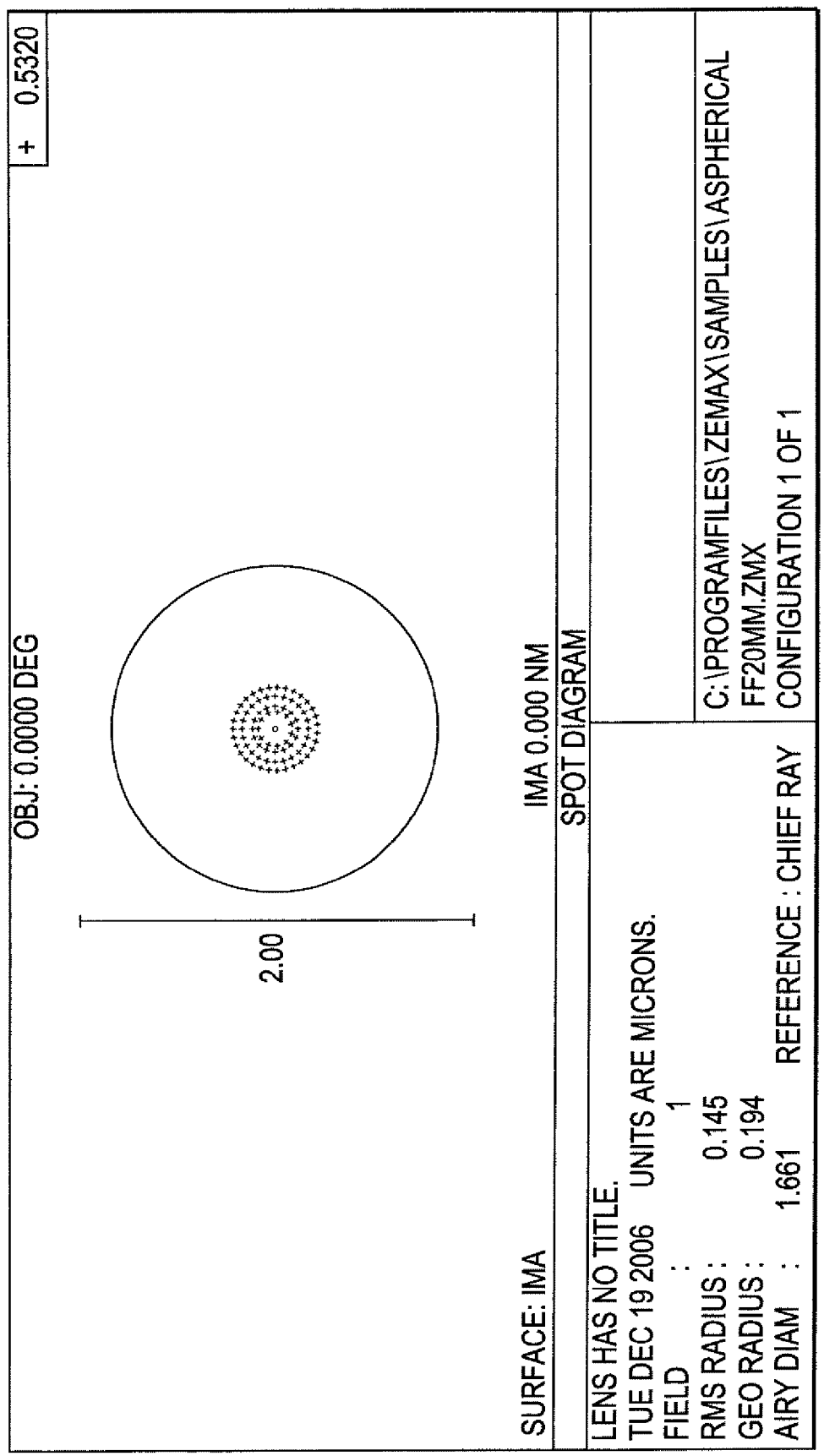
FIG. 20 shows a software window of software used for designing a rotationally symmetrical aspheric lens. The software window shows a spot diagram of the rotationally symmetrical aspheric lens.
Figure 21:
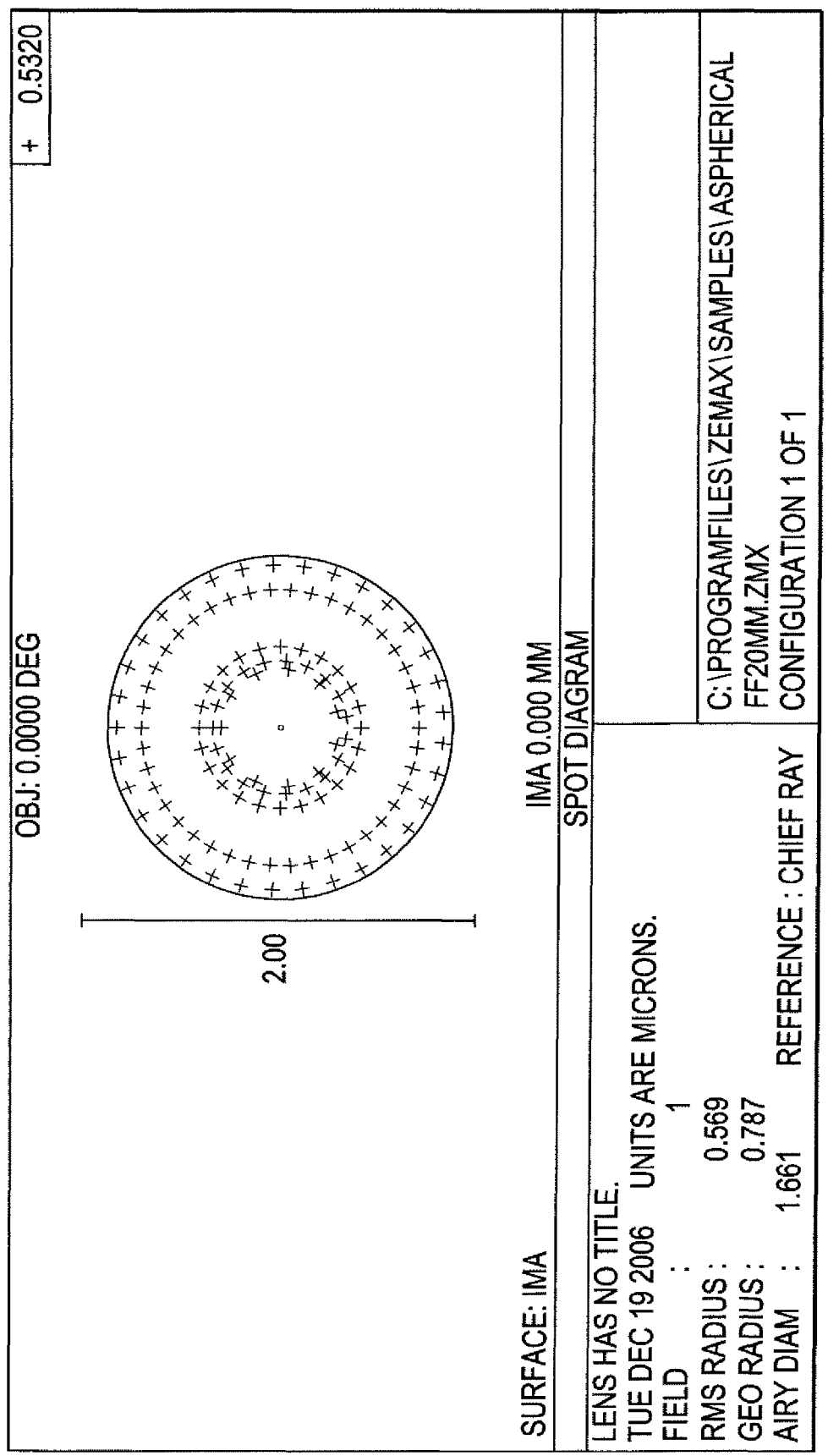
FIG. 21 shows a software window of software used for designing a rotationally symmetrical aspheric lens. The software window shows a spot diagram of the rotationally symmetrical aspheric lens.
Figure 22:
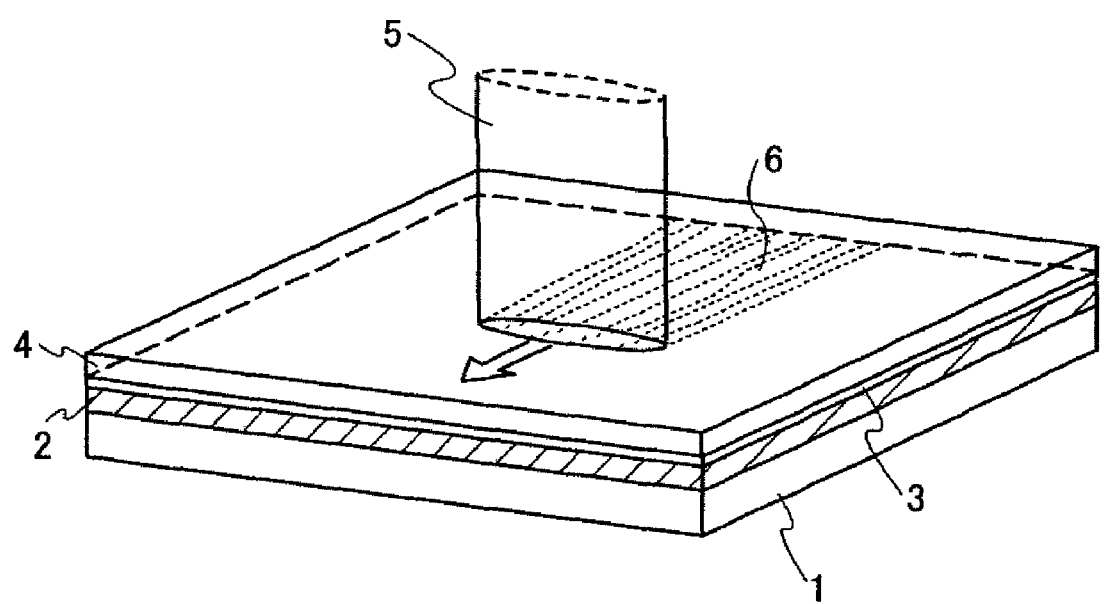
FIG. 22 is a perspective view showing a method of crystallizing a semiconductor film which was developed by the present inventors.
Figure 23:
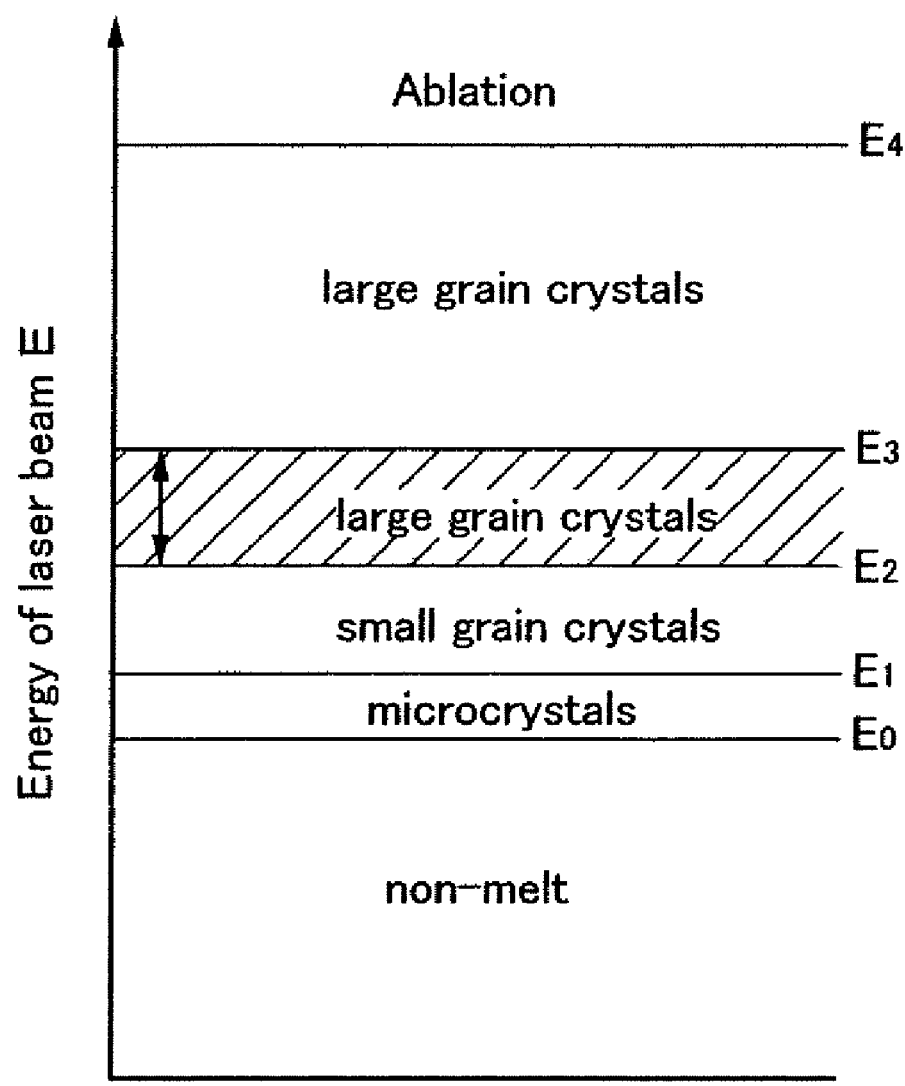
FIG. 23 shows the relationship between laser beam energy and crystal structure of a semiconductor film in a method of crystallizing a semiconductor film developed by the present inventors.

FIGS. 19, 20, and 21 are windows which show spot diagrams. It can be seen from the spot diagrams in FIGS. 19 to 21 that a beam spot can be condensed to have a diameter of less than or equal to 2 μm by the rotationally symmetrical aspheric lens designed using the lens data in FIG. 17.

The rotationally symmetrical aspheric lens having a curved surface described by the lens data in FIG. 17 has very little spherical aberration, and therefore can condense a beam spot such that the beam spot has a diameter of less than or equal to 2 μm. Accordingly, by designing a rotationally symmetrical aspheric cylindrical lens having a refractive index only in one axial direction based on the rotationally symmetrical aspherical surface described by the lens data in FIG. 17, a lens which condenses a beam spot to a very narrow linear shape having a width of approximately 2 μm can be manufactured.

Note that the rotationally symmetrical aspheric cylindrical lens designed based on the lens data in FIG. 17 has a focal depth of approximately ±2 μm. Therefore, in the case of crystallizing a semiconductor film having a surface roughness larger than the range of the focal depth, preferably irradiation with the laser beam is performed while focus is adjusted using an autofocus device.

Because the spherical aberration of the aspheric cylindrical lens is small, as shown in FIGS. 19 to 21, a beam can be condensed to a very narrow linear shape by the aspheric cylindrical lens such that it has a beam width of less than or equal to 2 μm. Further, a gradient index lens which refracts a beam which passes and condenses the beam to a very narrow linear shape with a width of less than or equal to 2 μm, in a similar manner to the aspheric cylindrical lens of this embodiment, can also be designed. A gradient index lens may be designed by setting the gradient of a refractive index of a lens medium.

This application is based on Japanese Patent Application Serial No. 2007-013868 filed on Jan. 24, 2007 with the Japanese Patent Office, the entire contents of which are hereby incorporated by reference.

What is claimed is:

1. A method of crystallizing a semiconductor film, comprising the steps of:
    forming a cap film over an amorphous semiconductor film, wherein the cap film is an insulting film; and
    irradiating the amorphous semiconductor film with a linear laser beam through the cap film and completely melting the amorphous semiconductor film to form a crystalline semiconductor film comprising a plurality of crystal grains and align crystal plane orientations of the plurality of crystal grains to each other, while scanning the linear laser beam,
    wherein a width of the linear laser beam on a surface which is irradiated in a direction parallel to a scanning direction of the linear laser beam is equal to or less than a width of one of the plurality of crystal grains of the crystalline semiconductor film in a direction perpendicular to the scanning direction of the linear laser beam, and
    wherein a thickness of the cap film is larger than or equal to 200 nm and smaller than or equal to 600 nm.

2. The method of crystallizing a semiconductor film according to claim 1, wherein the linear laser beam is formed by passing a laser beam through an aspheric cylindrical lens.

3. The method of crystallizing a semiconductor film according to claim 1, wherein the linear laser beam is formed by passing a laser beam through a gradient index lens.

4. The method of crystallizing a semiconductor film according to claim 1, wherein the width of the linear laser beam on a surface which is irradiated is less than or equal to 5 μm.

5. The method of crystallizing a semiconductor film according to claim 1, wherein a laser beam emitted from a continuous wave laser or a quasi-continuous wave laser is processed into the linear laser beam.

6. The method of crystallizing a semiconductor film according to claim 1,
    wherein the direction parallel to the scanning direction of the linear laser beam is a minor axis direction of the linear laser beam, and
    wherein the direction perpendicular to the scanning direction of the linear laser beam is a major axis direction of the linear laser beam.

7. A method of manufacturing a semiconductor device, comprising the steps of:
    forming a cap film over an amorphous semiconductor film, wherein the cap film is an insulating film;
    irradiating the amorphous semiconductor film with a linear laser beam through the cap film and completely melting the amorphous semiconductor film to form a first crystalline semiconductor film comprising a plurality of crystal grains and align crystal plane orientations of the plurality of crystal grains to each other, while scanning the linear laser beam; and
    processing the first crystalline semiconductor film into a predetermined form, to form a second crystalline semiconductor film; and
    forming an element, which includes a channel forming region in the second crystalline semiconductor film,
    wherein a width of the linear laser beam on a surface which is irradiated in a direction parallel to a scanning direction of the linear laser beam is equal to or less than a width of one of the plurality of crystal gains of the first crystalline semiconductor film in a direction perpendicular to the scanning direction of the linear laser beam, and
    wherein a thickness of the cap film is larger than or equal to 200 nm and smaller than or equal to 600 nm.

8. The method of manufacturing a semiconductor device according to claim 7, wherein the linear laser beam is formed by passing a laser beam through an aspheric cylindrical lens.

9. The method of manufacturing a semiconductor device according to claim 7, wherein the linear laser beam is formed by passing a laser beam through a gradient index lens.

10. The method of manufacturing a semiconductor device according to claim 7, wherein the width of the linear laser beam on a surface which is irradiated is less than or equal to 5 μm.

11. The method of manufacturing a semiconductor device according to claim 7, wherein a laser beam emitted from a continuous wave laser or a quasi-continuous wave laser is processed into the linear laser beam.

12. The method of manufacturing a semiconductor device according to claim 7,
    wherein the direction parallel to the scanning direction of the linear laser beam is a minor axis direction of the linear laser beam, and
    wherein the direction perpendicular to the scanning direction of the linear laser beam is a major axis direction of the linear laser beam.

* * * * *

UNITED STATES PATENT AND TRADEMARK OFFICE
CERTIFICATE OF CORRECTION

| | | |
|---|---|---|
| PATENT NO. | : 8,349,714 B2 | Page 1 of 1 |
| APPLICATION NO. | : 11/972029 | |
| DATED | : January 8, 2013 | |
| INVENTOR(S) | : Koichiro Tanaka et al. | |

It is certified that error appears in the above-identified patent and that said Letters Patent is hereby corrected as shown below:

In the Specification:

Column 5, line 57, "FIGS. 5A to 8F" should read "FIGS. 8A to 8F"

Column 10, line 32, "Oh to be processed" should read "Ob to be processed"

Column 12, line 30, "abbreviated as 'TFR'" should read "abbreviated as 'TFT'"

Column 26, line 52, "substrate i5 456" should read "substrate 456"

In the Claims:

Column 30, Claim 7, line 39, "crystal gains" should read "crystal grains"

Signed and Sealed this
Thirtieth Day of April, 2013

Teresa Stanek Rea
*Acting Director of the United States Patent and Trademark Office*